United States Patent [19]
Kuriyama et al.

[11] Patent Number: 5,384,731
[45] Date of Patent: Jan. 24, 1995

[54] SRAM MEMORY STRUCTURE AND MANUFACTURING METHOD THEREOF

[75] Inventors: Hirotada Kuriyama; Yukio Maki; Yoshio Kohno, all of Hyogo, Japan

[73] Assignee: Mitsubishi Denki Kabushiki Kaisha, Tokyo, Japan

[21] Appl. No.: 194,367

[22] Filed: Feb. 9, 1994

[30] Foreign Application Priority Data

Feb. 10, 1993 [JP] Japan .................................. 5-023033
Dec. 8, 1993 [JP] Japan .................................. 5-307838

[51] Int. Cl.⁶ .............................................. G11C 13/00
[52] U.S. Cl. .................................. 365/182; 365/154
[58] Field of Search .................. 365/154, 182, 189.01, 365/230.01, 185

[56] References Cited

U.S. PATENT DOCUMENTS 4,835,740  5/1989  Sato ..................................... 365/185

FOREIGN PATENT DOCUMENTS 63-156352  12/1986  Japan .
63-211751   2/1987  Japan .
 1-298761   5/1988  Japan .
 2-71559    9/1988  Japan .
 3-34569    6/1989  Japan .
 3-234058   2/1990  Japan .
 3-242968   2/1990  Japan .
 4-107859   8/1990  Japan .
 4-274363   3/1991  Japan .

OTHER PUBLICATIONS

"16Mbit SRAM Cell Technologies for 2.0V Operation", Ohkubo et al. International Electron Devices Meeting 1991 Technical Digest pp. 481-484.
"Submicron Device I", Mitsumasa Koyanagi, Maruzen Kabushiki Kaisha, pp. 4-8.
"Static-Noise Margin Analysis of MOS SRAM Cells", Evert Seevinck, IEEE Journal of Solid-State Circuits, vol. sc-22, No. 5. Oct. 1987, pp. 748-754.
"Parasitic Resistance Effects on Static MOS RAM", Shinohara et al. VLSI '82, pp. 106-107.
"A 4-Mb CMOS SRAM with a PMOS Thin-Film-Transistor Load Cell", Ootani et al., IEEE Journal of Solid-State Circuits, vol. 25, No. 5, pp. 1082-1092.

*Primary Examiner*—Terrell W. Fears
*Attorney, Agent, or Firm*—Lowe, Price, LeBlanc & Becker

[57] ABSTRACT

The invention provides an SRAM memory cell structure permitting increase of integration density while maintaining operation stability. A memory cell in the SRAM includes a pair of access transistors, a pair of driver transistors, and a pair of load transistors. The gate insulating film of access transistor is formed of a single layer of silicon oxide film, while the gate insulating film of driver transistor is formed of a stacked layer formed of a silicon oxide film and a silicon nitride film. The pair of load transistors are formed of two layers of polycrystalline silicon layers stacked upon each other with an insulating film therebetween. A source region and a drain region are formed in each of polycrystalline silicon layers with each channel region therebetween. One drain region forms a gate opposite to the other channel region, while the other drain region forms a gate opposite to the one channel region.

16 Claims, 34 Drawing Sheets

FIG.6A  FIG.6B
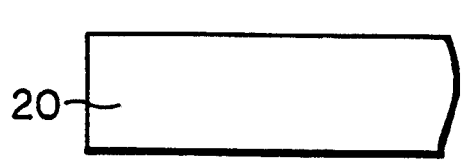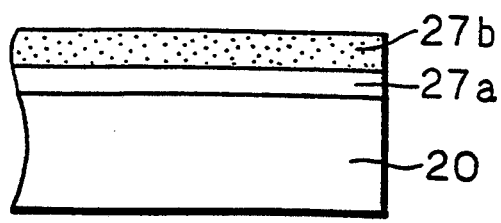
FIG.7A  FIG.7B
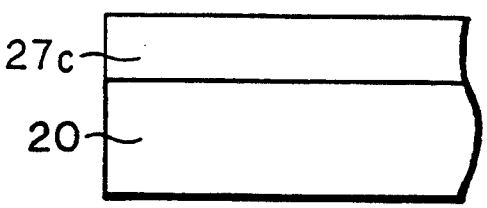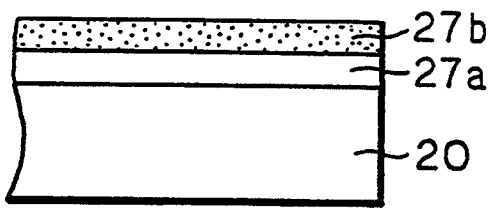
FIG.8A  FIG.8B
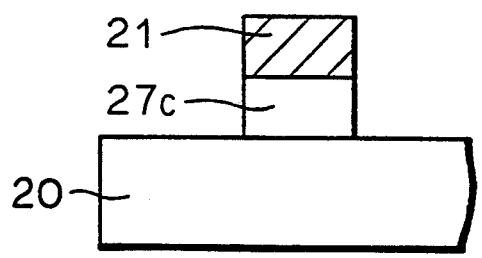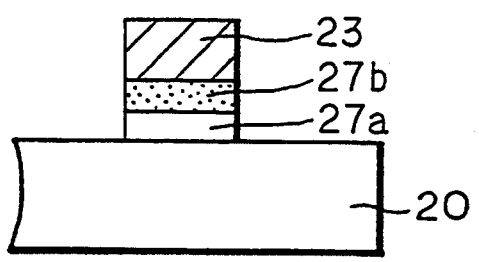

FIG.11A
FIG.11B
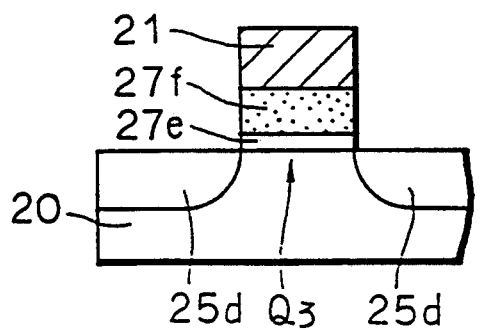
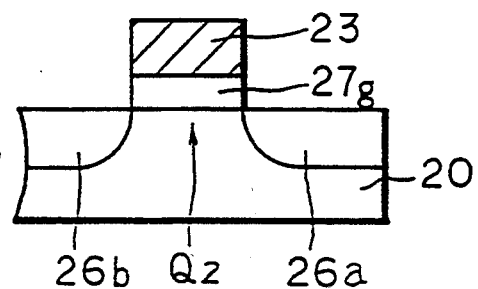

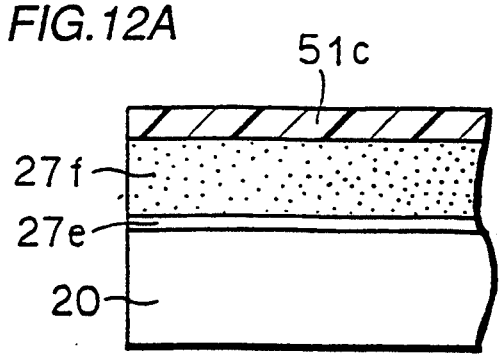
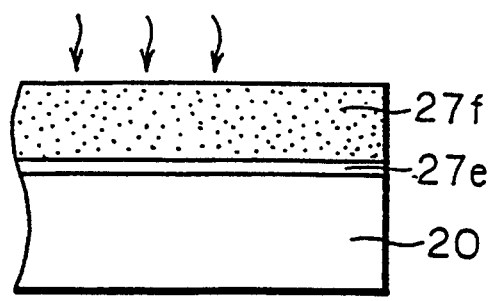
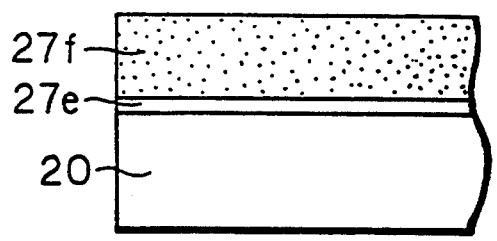
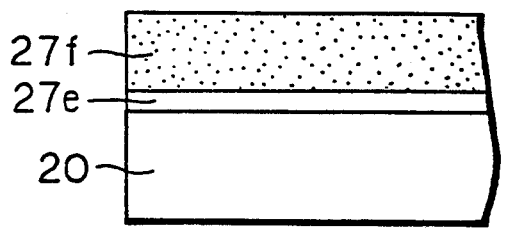
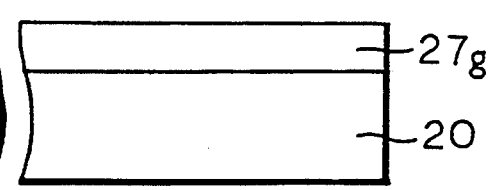

FIG.16A    FIG.16B
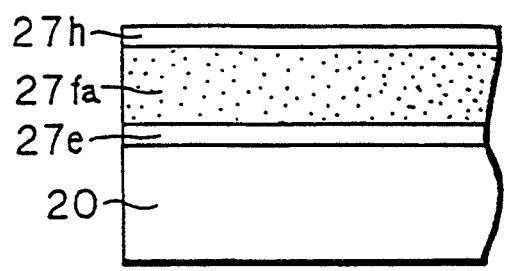
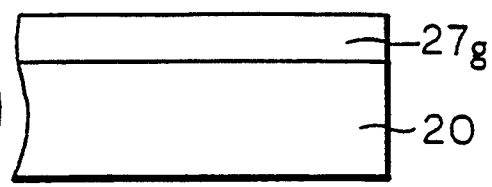
FIG.17A    FIG.17B
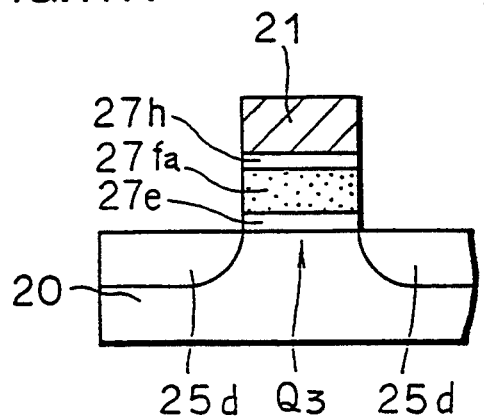
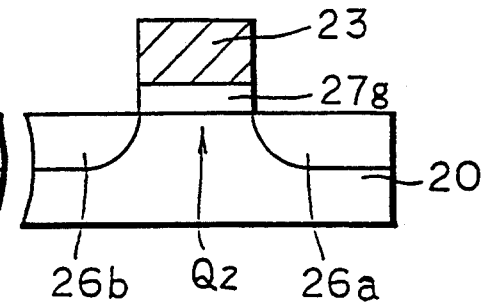

$V_{BB} = 0V$ $V_{BB} = -1V$

SRAM MEMORY STRUCTURE AND MANUFACTURING METHOD THEREOF

BACKGROUND OF THE INVENTION

1. Field of the Invention

The present invention relates generally to semiconductor memory devices and manufacturing methods thereof, and more specifically, to a memory structure for SRAM (Static Random Access Memory) and a manufacturing method thereof.

2. Description of the Background Art

Conventionally, SRAM is known as one kind of semiconductor memory device. FIG. 42 is an equivalent circuit diagram showing one memory cell of a conventional SRAM. Referring to FIG. 42, the memory cell uses a p type MOS (Metal Oxide Semiconductor) as a load, and is formed of six transistors. More specifically, a pair of driver transistors (for driving) $Q_1$ and $Q_2$ (n type MOS transistors) and a pair of load transistors $Q_5$ and $Q_6$ (p type MOS transistors) are connected with each other to constitute a flip-flop circuit.

The source regions 110 and 111 of the pair of load transistors $Q_5$ and $Q_6$ are connected to a power supply $V_{cc}$. The source regions of driver transistors $Q_1$ and $Q_2$ are connected to GNDs 112 and 113.

A pair of access transistors $Q_3$ and $Q_4$ (n type MOS transistors) are connected to storage nodes 114 and 115, respectively. A bit line 107 is connected to one of the source/drain regions of access transistor $Q_3$. A bit line 108 is connected to one of the source/drain regions of access transistor $Q_4$. The gate electrodes of access transistors $Q_3$ and $Q_4$ are connected to a word line 109.

Now, a conventional SRAM memory cell structure will be described by way of illustrating a document (International Electron Device Meeting 1991 Technical Digest pp. 481–484).

FIGS. 43A and 43B are plan views showing a conventional SRAM memory cell structure divided into two stages from the bottom layer. More specifically, FIG. 43A illustrates driver transistors Q1 and Q2 and access transistors Q3 and Q4 formed on a substrate, while FIG. 43B illustrates thin film transistors (TFT) $Q_5$ and $Q_6$. FIG. 44 is a schematic sectional view taken along line G—G in FIGS. 43A and 43B.

Referring to FIGS. 43A, 43B, and 44, in the conventional memory cell, a pair of driver transistors $Q_1$ and $Q_2$ and a pair of access transistor $Q_3$ and $Q_4$ are formed at a main surface of a p type well 120. Driver transistor $Q_1$ has a drain region 125a and a source region 125b opposing to each other with a channel region 125c therebetween, and a gate electrode 124. Driver transistor $Q_2$ has a drain region 126a and a source region 126b opposing to each other with a channel region 126c therebetween, and a gate electrode 123.

Access transistor $Q_3$ has a pair of source/drain regions 125d opposing to each other with a channel region 125e therebetween, and a gate electrode 121. Access transistor $Q_4$ has a pair of source/drain regions 126d opposing to each other with a channel region 126e therebetween, and a gate electrode 122.

These transistors are formed of n type MOS transistors having source/drain regions formed on the main surface of p type well 120. The gate electrode 123 of driver transistor $Q_2$ is connected to the source/drain region 125d of access transistor $Q_3$ and the drain region 125a of driver transistor $Q_1$ through a contact portion 123a. The gate electrode 124 of driver transistor $Q_1$ is connected to the source/drain region 126d of access transistor $Q_4$ and the drain region 126a of driver transistor $Q_2$ through a contact portion 124a.

The drain region 143a of load transistor $Q_5$ and the gate electrode 142 of load transistor $Q_6$ are connected to the gate electrode 124 of driver transistor $Q_1$ through a contact portion 143d. The drain region 144a of load transistor $Q_6$ and the gate electrode 141 of load transistor $Q_5$ are connected to the gate electrode 123 of driver transistor $Q_2$ through a contact portion 144d.

A tungsten silicide layer 135 to be a GND line is formed at the position of an intermediate layer between driver transistor $Q_1$, $Q_2$ and access transistor $Q_3$, $Q_4$, and load transistors $Q_5$, $Q_6$.

A bit line 139 is connected to the source/drain region 125d of access transistor $Q_3$ with a plug layer 137 therebetween. The other bit line (not shown) is connected to the source/drain region 126d of access transistor $Q_4$ with a plug layer therebetween as in the case of bit line 139.

Load transistors $Q_5$ and $Q_6$ each formed of a thin film transistor have gate electrodes 141 and 142 lying under channel regions 143c and 144c, respectively, and each constitutes a so-called bottom gate type transistor.

FIG. 45 is a sectional view showing a typical cross section of a thin film transistor used for load transistors $Q_5$ and $Q_6$. Referring to FIG. 45, the thin film transistor includes channel region 144c, drain region 144a, and source region 144b formed in a semiconductor layer such as of polycrystalline silicon. Gate electrode 142 is formed at a position opposing to channel region 144c with an insulating layer therebetween. FIG. 46 is a graphic representation showing the current characteristic of the above-described thin film transistor. In FIG. 46, Vd represents drain voltage, Vg gate voltage, and Id drain current.

In such an SRAM, in order to increase the integration density of memory cells, an area occupied by each memory cell on plane must be reduced. More specifically, the area on plane occupied by driver transistors $Q_1$, $Q_2$, access transistors $Q_3$, $Q_4$, and load transistors $Q_5$, $Q_6$ must be reduced. The above-described conventional memory cell is however encountered with the following two disadvantages in increasing integration density.

The first disadvantage is instability in operation at the time of reading. Now, this disadvantage will be described in more detail.

FIGS. 47A and 47B are diagrams showing an equivalent circuit of the memory cell shown in FIG. 42 by dividing it into two inverter circuits related to reading operation. Referring to FIGS. 47A and 47B, load transistors $Q_5$ and $Q_6$ are not illustrated, because current flowing across them is significantly small. The reading characteristic of the memory cell is produced from voltage change at the storage node thereof, with a bit line and a word line fixed to Vcc, while changing the gate voltage of a driver transistor (voltage at the storage node of the other side).

FIG. 48 is a graphic representation showing the reading characteristic of the above-described SRAM. Referring to FIG. 48, the abscissa represents the voltage of storage node 115, while the ordinate represents the voltage of storage node 114. Curve $\alpha_1$ represents the voltage change characteristic of storage node 114 when the voltage of storage node 115 is changed. Curve $\gamma_1$ represents the voltage change characteristic of storage node 115 when the voltage of storage node 114 is changed. Curves $\alpha_1$ and $\gamma_1$ cross at three points $P_1$, $P_2$, and $P_3$. Point $P_3$ corresponds to storage node 114 storing "High" data, while point $P_1$ corresponds to storage node 115 storing "High" data. Point $P_2$ is an unstable point, and voltage does not stop at point $P_2$ at the time of reading. In the Figure, a region defined by circle $h_1$ is a so-called "memory cell eye". Generally, the larger the memory cell eye is, the more stable will be the reading operation.

The memory cell eye is discussed in Evert Seevinck et al., IEEE JOURNAL OF SOLID-STATE CIRCUITS, Vol. SC-22, No. 5, Oct. 1987 pp. 748–754, and H. Shinohara et al., VLSI '82, pp. 106–107.

There are several ways of enlarging a memory cell eye, and two approaches will be described in the following. The first method is to enlarge the driving capability ratio $\beta$ of driver transistor and access transistor (in other words driving capability of driver transistor/driving capability of access transistor). FIG. 49 is a graphic representation showing the reading characteristic when the driving capability ratio $\beta$ is increased with respect to the case shown in FIG. 48. Referring to FIG. 49, the memory cell eye is enlarged from circle $h_1$ to circle $h_2$.

The second approach is to reduce threshold voltage $V_{th}$ of access transistor. Vcc-$\theta_1$ (distance between Vcc and $\theta_1$) and Vcc-$\theta_2$ (distance between Vcc and $\theta_2$) in FIG. 48 correspond to the threshold voltages $V_{th}$ of access transistors $Q_3$ and $Q_4$, respectively. It is noted that $\theta_1$ and $\theta_2$ are High level voltages of the outputs of the respective inverters. FIG. 50 is a graphic representation showing the characteristic when the threshold voltage $V_{th}$ of access transistor is reduced with respect to the case of FIG. 48. Referring to FIG. 50, if the threshold voltages $V_{th}$ of access transistors $Q_3$ and $Q_4$ are reduced to Vcc-$\theta_3$ and Vcc-$\theta_4$, respectively, the memory cell eye is enlarged from circle $h_1$ to circle $h_3$.

Referring to FIG. 43A, a conventional approach for enlarging a memory cell eye is to increase the gate widths $W_D$ of driver transistors $Q_1$ and $Q_2$, or to reduce the gate widths $W_A$ of access transistors $Q_3$ and $Q_4$. This is because the driving capability of a transistor is substantially proportional to its gate width. To increase the gate width $W_D$ of a driver transistor however hinders the memory cell from being reduced in size, and therefore is not preferable in view of high intensity integration. Meanwhile, to reduce the gate width $W_A$ of an access transistor gives rise to increase in the threshold voltage $V_{th}$ of the access transistor due to the narrow channel effect. Therefore, the memory cell eye is reduced conversely as described above, resulting in unstable reading operation.

As described above, such a conventional SRAM memory cell structure can not provide increase in integration density while maintaining operation stability.

The second disadvantage is due to the limits of manufacture by photolithography techniques. Now, the limits will be described in more detail.

Load transistors $Q_5$ and $Q_6$ employed in the conventional SRAM memory cell structure shown in FIGS. 43A and 43B are both bottom gate type thin film transistors. Referring to FIG. 43B in particular, the gates 141 and 142 of load transistors $Q_5$ and $Q_6$ are formed of one layer. More specifically, when load transistors $Q_5$ and $Q_6$ are formed, a conductive layer is formed first, and then gate electrodes 141 and 142 are formed from the conductive layer by patterning utilizing a photolithography technique or the like. In the present state of the art, a minimum manufacturing size in patterning by means of photolithography is about 0.35 μm and therefore the size of each portion of gate electrodes 141 and 142 patterned by means of photolithography ($L_3$ and $L_4$, for example) can not be smaller than 0.35 μm.

The source/drain regions of load transistor $Q_5$, $Q_6$ and layers 143, 144 to be channel regions are both also formed of one layer. Accordingly, the size of each portion of layers 143 and 144 ($L_5$ for example) can not be smaller than 0.35 μm either.

As described above, with the limits in the manufacture utilizing photolithography techniques, it is difficult to reduce the occupied area of load transistors $Q_5$ and $Q_6$ on plane, and the conventional SRAM memory cell structure is not statable for high density integration in this regard as well.

The structure of load transistors $Q_5$, $Q_6$ which is less susceptible to the limits in the manufacture by photolithography techniques as described above is disclosed in Japanese Patent Laying-Open No. 3-34569.

Meanwhile, FIG. 51 is a plan view schematically showing the structure of a load transistor in Japanese Patent Laying-Open No. 3-34569. Referring to FIG. 51, the pair of load transistors are formed of two polycrystalline silicon layers 301 and 303 piled upon each other with an insulating film (not shown) therebetween. A drain region 301a and a source region 301b are formed with a channel region 301c therebetween in polycrystalline silicon layer 301. A drain region 303a and a source region 303b are formed with a channel region 303c therebetween in polycrystalline silicon layer 303. A drain region 303a to be a gate electrode is present on the underlying channel region 301c with an insulating film therebetween. Drain region 301a to be a gate electrode is present under the overlying channel region 303c with the insulating film therebetween.

Thus, in the structure of the pair of load transistors, one constitutes a bottom gate type transistor and the other a top gate type transistor. The drain region of one transistor uses the gate electrode of the other transistor. Therefore, the limits in the manufacture by photolithography described above are reduced. The load transistor structure is therefore suitable for high density integration. The drain region 301a of the underlying polycrystalline silicon film 301 is not covered with overlying polycrystalline silicon film 303. Accordingly, an impurity can be implanted into drain region 301a in a self-aligned manner.

In the load transistor structure, however, channel regions 301c and 303c both has an approximately L-shape. If, for example, misregistration of a mask at the time of patterning polycrystalline silicon thin film 303 causes the overlying polycrystalline silicon thin film 303 to be shifted with respect to the underlying polycrystalline silicon thin film 301 in the direction indicated by arrow J or K, the sizes $L_6$, $L_7$, $W_1$, and $W_2$ of the portions of channel regions 301c and 303c can easily be changed.

FIG. 52 is a plan view schematically showing how the dimension of a channel region is changed by misregistration of a mask. Referring to FIG. 52, the load transistor pair structure shown in FIG. 51 has its channel region dimension easily changed. Accordingly, a load transistor having a desired characteristic can not be obtained. It is also difficult to provide stable operation.

As described above, in load transistors employed for a conventional SRAM memory cell structure, it was not possible to provide a structure suitable for high intensity integration while maintaining stable operation.

SUMMARY OF THE INVENTION

It is an object of the invention to provide an SRAM memory cell structure suitable for high density integration.

Another object of the invention is to produce the size of an SRAM memory cell structure while maintaining stability in the operation of the SRAM.

Yet another object of the invention is to provide an SRAM memory cell structure which is less restricted by the limits of dimension in the manufacture by photolithography, and permits stable operation.

A still further object of the invention is to provide a method of manufacturing an SRAM memory cell structure suitable for high intensity integration.

A semiconductor memory device according to one aspect of the invention includes a static type memory cell having a pair of driver transistor of first type conductivity and a pair of load transistors of second type conductivity constituting a flip-flop circuit, and a pair of access transistors. The semiconductor memory device includes a semiconductor substrate, driver transistors, and access transistors. The driver transistors and access transistors are formed on a main surface of the semiconductor substrate. Each of the driver transistors is formed of a first field effect transistor, and each of the access transistors is formed of a second field effect transistor. The first field effect transistor is formed on the main surface of the semiconductor substrate, and includes a first gate insulating film having a first dielectric constant and a first gate electrode formed on the first gate insulating film. The second field effect transistor is formed on the main surface of the semiconductor substrate and includes a second gate insulating film having a second dielectric constant smaller than the first dielectric constant, and a second gate electrode formed on the second gate insulating film.

In a semiconductor memory device according to another aspect of the invention, a first field effect transistor has a first gate insulating film having a first dielectric constant. A second field effect transistor has a second gate insulating film having a second dielectric constant. Since the dielectric constants of the gate insulating films are different between the first and second field effect transistors, the current driving capabilities of the field effect transistors can be made different. More specifically, the driving capability of the first field effect transistor can be larger than the driving capability of the second field effect transistor. In other words the current driving capability ratio of the first/second field effect transistors can be large. Thus, the memory cell eye can be made large without increasing the gate width of driver transistor, stable reading operation can be achieved, and therefore an SRAM memory cell structure suitable for high density integration can be provided.

This approach provides easier control of the film thickness of a gate insulating film as compared to the case in which the film thicknesses of the first and second gate insulating films of the same material are changed to increase the current driving capability ratio. Therefore, the difference in thickness between the first and second gate insulating films can be kept small, while the large driving capability ratio can be secured. Accordingly, patterning by means of photolithography over the gate insulating films can be accurately performed, and faults in patterns are not likely to be generated.

A semiconductor memory device according to another aspect of the invention includes a static type memory cell having a pair of driver transistors of first type conductivity and a pair of load transistors of second type conductivity constituting a flip-flop circuit, the driver transistors and access transistors are formed of field effect transistors formed on a main surface of a semiconductor substrate, and the load transistors are formed of first and second thin film transistors formed on a field effect transistor. The semiconductor device includes a first semiconductor layer, a second semiconductor layer, first source/drain regions, second source/drain regions, a first gate insulating film, and a second gate insulating film. The first semiconductor layer is formed in the upper part of the semiconductor substrate, and has a first strip portion extending in a first direction and a second strip portion extending in a second direction. The second semiconductor layer is formed on the first semiconductor layer, and has a third strip portion extending in a third direction crossing the second direction, and a fourth strip portion extending in a fourth direction crossing the first direction. The first source/drain regions are formed in the first strip portion a distance apart from each other so as to define a first channel region opposing to the fourth strip portion and form a first thin film transistor. The second source/drain regions are formed in the third strip portion a distance apart from each other so as to define a second channel region opposing to the second strip portion and form a second thin film transistor. The first gate insulating film is formed between the fourth strip portion and the first channel region. The second gate insulating film is formed between the second strip portion and the second channel region. The first semiconductor layer and the second semiconductor layer overlap on each other between the first strip portion and the fourth strip portion, and between the second strip portion and the third strip portion.

In the semiconductor device according to this aspect, one of the pair of load transistors is formed of the first source/drain regions formed in the first semiconductor layer and defining the first channel region, and the gate electrode of one of the second source/drain regions in the second semiconductor layer. The other load transistor is formed of the second source/drain regions formed in the second semiconductor layer and defining the second channel region, and the gate electrode of one of the first source/drain regions in the first semiconductor layer. Therefore, one of the transistor forms a top gate type transistor, while the other a bottom gate type transistor. One of the source/drain regions of one transistor shares the gate electrode of the other transistor. Therefore, the limit in size in the manufacture by photolithography is reduced as compared to the case of forming both of load transistor pair into top gate type or bottom gate type. Consequently, the area occupied by the load transistor pair on the plane can be reduced, and an SRAM memory cell structure suitable for high density integration can be provided.

The first strip portion and the fourth strip portion having a prescribed width cross each other, and the first channel region is formed in the crossing region of the first strip portion. The channel length and the channel width of the first channel region are therefore defined by the widths of the first and fourth strip portions. The first and fourth strip portions are both formed to extend in a prescribed width. Therefore, if the fourth strip portion is formed shifted from a prescribed position with respect to the first strip portion due to mask misregistration or the like, the channel length and the channel width of the first channel region defined by the widths of the first and fourth strip portions are not changed. Since the third channel region is similarly defined by the widths of the second and third strip portions, its size is not changed by mask misregistration. Accordingly, a load transistor having a desired characteristic can easily be obtained by deciding the width of each strip portion, and therefore stable operation can be achieved.

A semiconductor memory device according to yet another aspect of the invention includes a static type memory cell having a pair of driver transistors of first type conductivity and a pair of load transistors of second type conductivity constituting a flip-flop circuit and a pair of access transistors, the driver transistors and access transistors are formed of field effect transistors formed on a main surface of a semiconductor substrate, and the load transistors are formed of first and second thin film transistors formed on a field effect transistor. The semiconductor memory device includes a first semiconductor layer, a second semiconductor layer, first source/drain regions, second source/drain regions, and a gate insulating film. The first semiconductor layer is formed in the upper part of the semiconductor substrate and has a The first strip portion extending in a first direction second semiconductor layer is formed on the first semiconductor layer and has a second strip portion extending in the second direction crossing the first direction. The first source/drain regions are formed in the first strip portion a distance apart from each other to define the first channel region and forms the first thin film transistor. The second source/drain regions are formed in the second strip portion a distance apart from each other to define the second channel region, and form the second thin film transistor. The gate insulating film is formed between the first channel region and the second channel region. The first and second strip portions are so disposed that the first and second channel regions face each other.

In the semiconductor memory device according to this aspect of the invention, one of the load transistor pair is formed of the first source/drain regions defining the first channel region formed in the first semiconductor layer and the gate electrode formed the second channel region in the second semiconductor layer. The other load transistor is formed of the second source/drain regions, and the gate electrode formed of the first channel region and the first semiconductor layer. Therefore, one of the load transistor pair constitutes a top gate type transistor, while the other a bottom gate type. One of the source/drain regions of one transistor shares the gate electrode of the other transistor. Therefore, the limits in size in the manufacture by photolithography are reduced as compared to the case of manufacturing both of the load transistor pair into top gate type or bottom gate type. As a result, the area occupied by the pair of load transistors on the plane can be reduced, and therefore an SRAM memory cell structure suitable for high density integration can be provided.

The first strip portion and second strip portion having prescribed widths cross each other, and the first channel region is formed in the crossing region in the first strip portion. The second channel region is formed in the crossing region in the second strip portion. The channel lengths and channel widths of the first and second channel regions are defined by the widths of the first and second strip portions. The first and second strip portions are both formed to extend in a prescribed width. If the second strip portion is formed shifted from a prescribed position with respect to the first strip portion due to mask misregistration or the like, the dimension of the channel lengths and channel widths of the first and second channel regions defined by the widths of the first and second strip portions is not changed. Accordingly, a pair of load transistors having a desired characteristic can readily be obtained by deciding the widths of the first and second strip portions, and therefore stable operation can be achieved.

In addition, the first and second semiconductor layers are so disposed that the first and second channel regions are opposite to each other. In other words the first channel region constitutes the gate electrode of the second thin film transistor, while the second channel region constitutes the gate electrode of the first thin film transistor.

Therefore, there is needed only one intersecting region between the first and second semiconductor layers. As a result, it is not necessary to cross the first and second layers in a number of regions. This makes it easy to arrange the first and second semiconductor layers, and two dimensionally occupied area can be reduced.

A method of manufacturing a semiconductor memory device according to one aspect of the invention manufactures a semiconductor memory device including a static type memory cell having a pair of driver transistors of first type conductivity and a pair of load transistors of second type conductivity constituting a flip-flop circuit and a pair of access transistors, and the method includes the following steps.

A first gate insulating film having a first dielectric constant is formed on a main surface of a semiconductor substrate. Then, a second gate insulating film having a second dielectric constant smaller than the first dielectric constant is formed on the main surface of the semiconductor substrate. A first gate electrode is formed on the first gate insulating film. A second gate electrode is formed on the second gate insulating film. Thus, a first field effect transistor forming each of the driver transistors is formed to include the first gate insulating film and the first gate electrode, and a second field effect transistor forming each of the access transistors is formed to include the second gate insulating film and the second gate electrode.

A method of manufacturing a semiconductor device manufactures a semiconductor memory device according to another aspect of the invention manufactures a semiconductor memory device including a static type memory cell having a pair of driver transistors of first type conductivity and the pair of load transistors of second type conductivity constituting a flip-flop circuit and a pair of access transistors, the driver transistors and access transistors are formed of field effect transistors formed on a main surface of a semiconductor substrate, and the load transistors are formed of first and second thin film transistors formed on a field effect transistors. The method includes the following steps.

In the upper part of the semiconductor substrate, a first semiconductor layer having a first strip portion extending in a first direction and a second strip portion extending in a second direction. An insulating film is formed on the first semiconductor layer. A second semiconductor layer having a third strip portion extending in a third direction crossing the second direction and a fourth strip portion extending in a fourth direction crossing the first direction is formed on the insulating film so that the third strip portion crosses the second strip portion and the fourth strip portion crosses the first strip portion. First source/drain regions forming the first thin film transistor are formed in the first strip portion a distance apart from each other to define the crossing region of the first strip portion and the fourth strip portion as a channel region. Second source/drain regions forming the second thin film transistor are formed in the third strip portion a distance apart from each other to define the crossing region of the third strip portion and the second strip portion as a channel region.

A method of manufacturing a semiconductor device according to another aspect of the invention is a method of manufacturing a semiconductor device having a pair of driver transistors of first type conductivity and a pair of load transistors of second type conductivity constituting a flip-flop circuit, and a pair of access transistors, the driver transistors and access transistors are formed of field effect transistors formed on a main surface of a semiconductor substrate, and a load transistor includes a static type memory cell formed of first and second thin film transistors formed on a field effect transistor. The method includes the following steps.

In the upper part of the semiconductor substrate, a first semiconductor layer having a first strip portion extending in a first direction is formed. An insulating film is formed on the first semiconductor layer. A second semiconductor layer having a second strip portion extending in a second direction crossing the first direction is formed on the insulating film so that the second strip portion crosses the first strip portion. First source/drain regions forming the first thin film transistor are formed in the first strip portion a distance apart from each other to define the crossing region of the first strip portion and second strip portion as a channel region. Second source/drain regions forming the second thin film transistor are formed in the second strip portion a distance apart from each other to define the region of the second strip portion crossing the first strip portion as a channel region.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A-8A and FIGS. 3B-8B are cross sectional views schematically showing in the order of steps methods of manufacturing an access transistor and a driver transistor employed for the SRAM memory cell structure according to the first embodiment of the invention;

FIGS. 11A and 11B are sectional views schematically showing the access transistor and driver transistor employed for the SRAM memory cell structure according to the first embodiment of the invention when the materials of the gate insulating films are changed;

FIGS. 12A-14A and FIGS. 12B-14B are sectional views schematically showing in the order of steps methods of manufacturing the access transistor and driver transistor corresponding to FIGS. 11A and 11B;

FIGS. 16A and 16B are sectional views showing manufacturing methods of the access transistor and driver transistor employed for the SRAM memory cell structure according to the first embodiment of the invention when the materials of the gate insulating films are changed;

FIGS. 17A and 17B are sectional views schematically showing the structure of the access transistor and driver transistor corresponding to FIGS. 16A and 16B;

FIGS. 22A-24A and FIGS. 22B-24B are sectional views schematically showing in the order of steps methods of manufacturing an access transistor and a driver transistor employed for an SRAM memory cell structure according to the second embodiment of the invention;

FIGS. 27A-31A and FIGS. 27B-31B are sectional views corresponding to FIGS. 26A and 26B schematically showing in the order of steps a method of manufacturing a load transistor employed for the SRAM memory cell structure according to the third embodiment of the invention;

FIGS. 35A-39A and FIGS. 35B-39B are sectional views corresponding to FIG. 34A and 34B schematically showing in the order of steps a method of manufacturing the load transistor employed for the SRAM memory cell structure according to the fourth embodiment of the invention;

DESCRIPTION OF THE PREFERRED EMBODIMENTS

Now, the preferred embodiments of the invention will be described in conjunction with the accompanying drawings.

Embodiment 1

Figure 1:
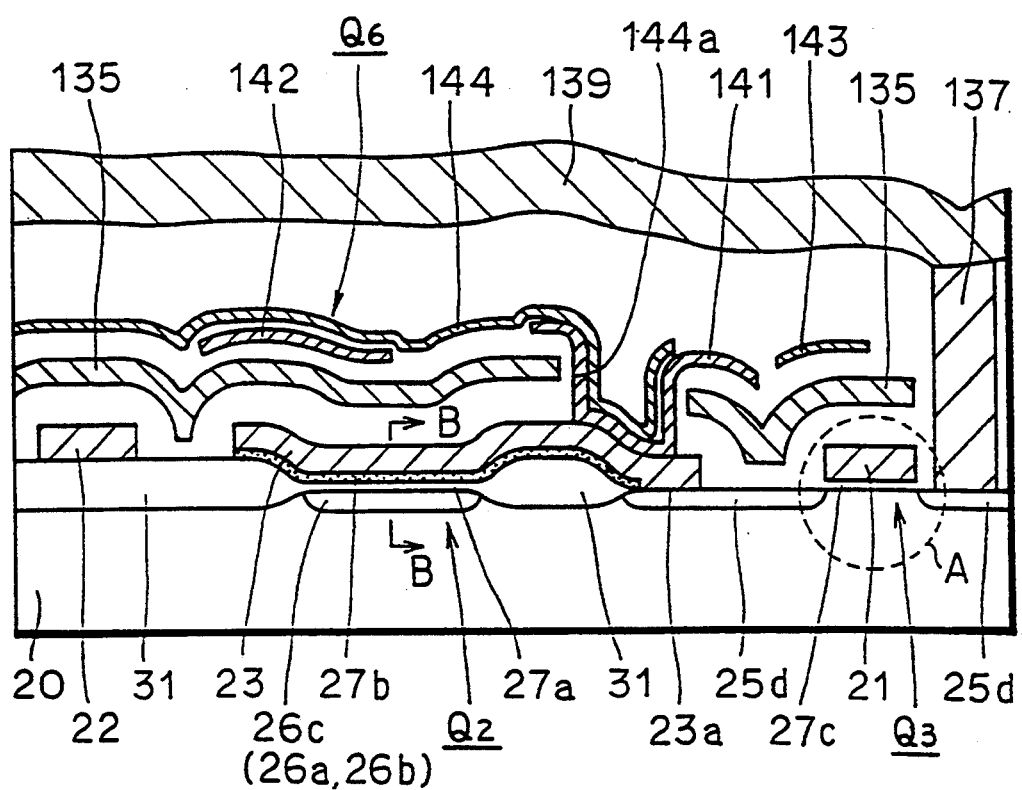
FIG. 1 is a sectional view schematically showing an SRAM memory cell structure according to a first embodiment of the invention in a cross section corresponding to FIG. 44.
Figures 2A, 2B:
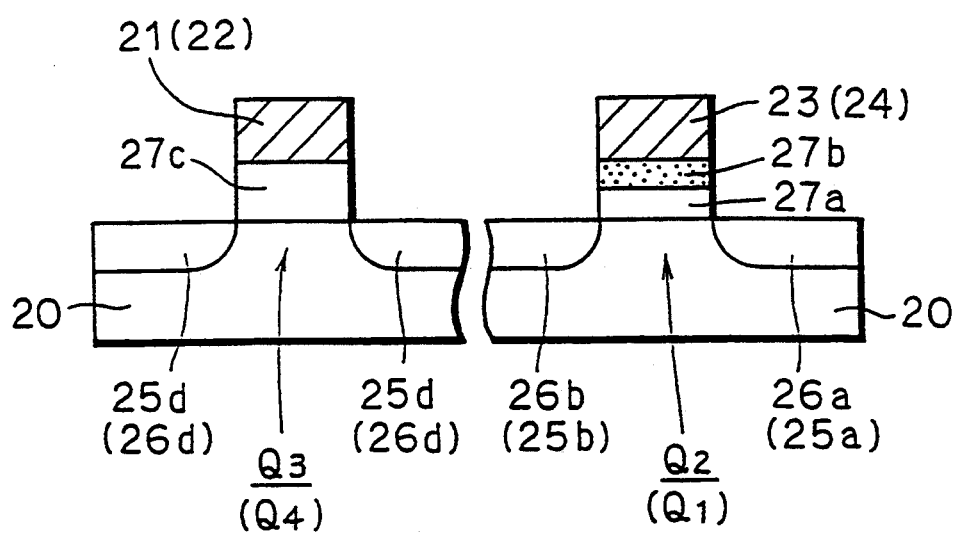
FIG. 2A is a schematic sectional view showing the structure of an access transistor in region A in FIG. 1 being enlarged.
FIG. 2B is a schematic sectional view showing a driver transistor taken along line B—B in FIG. 1.
Figure 44:
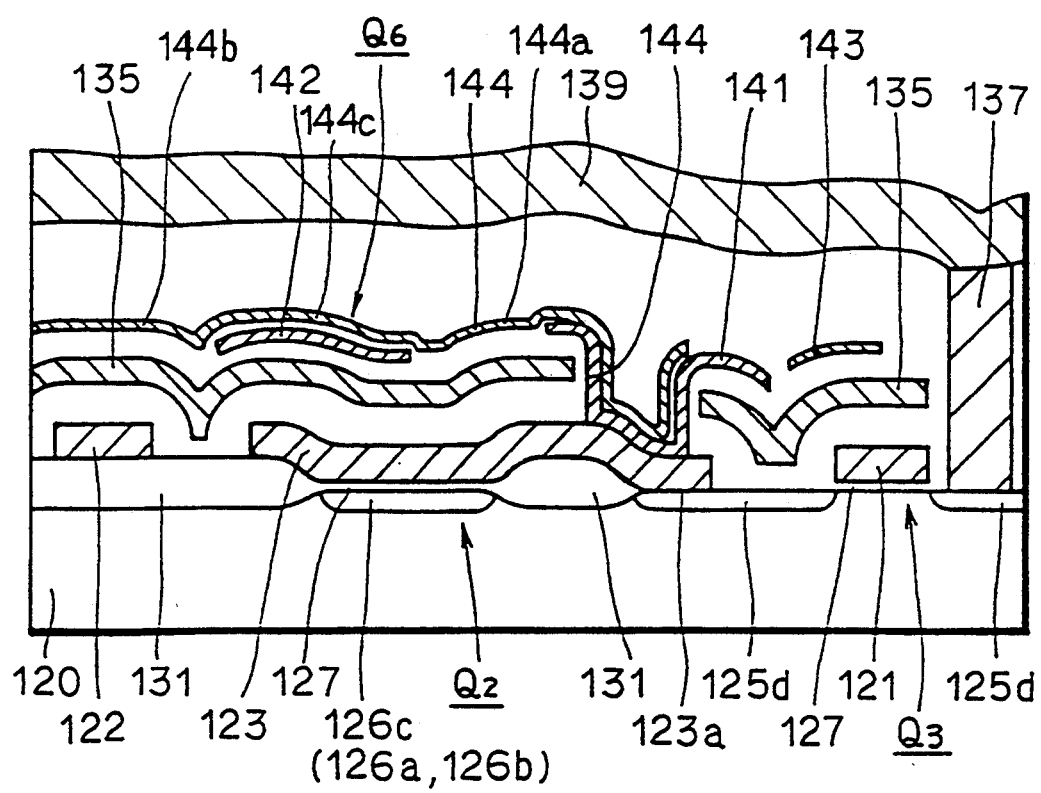
FIG. 44 is a sectional view taken along line G—G in FIGS. 43A and 43B.
Figure 45:
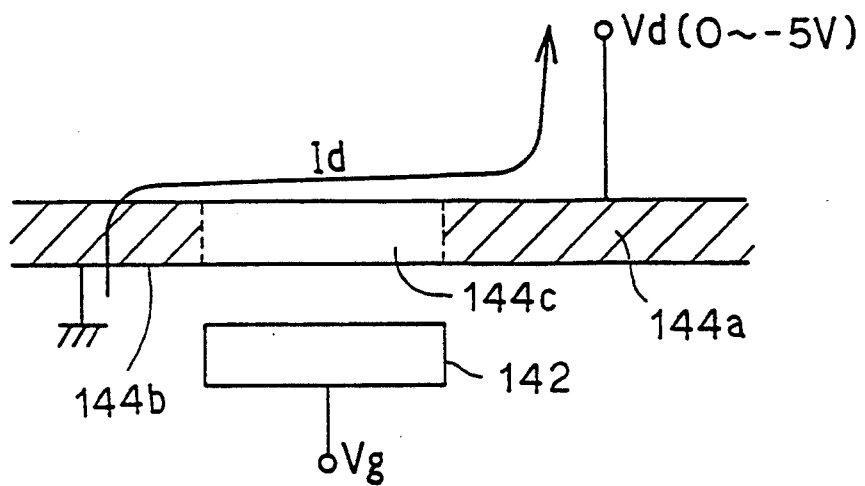
FIG. 45 is a sectional view showing a thin film transistor forming a conventional load transistor.
Figure 46:
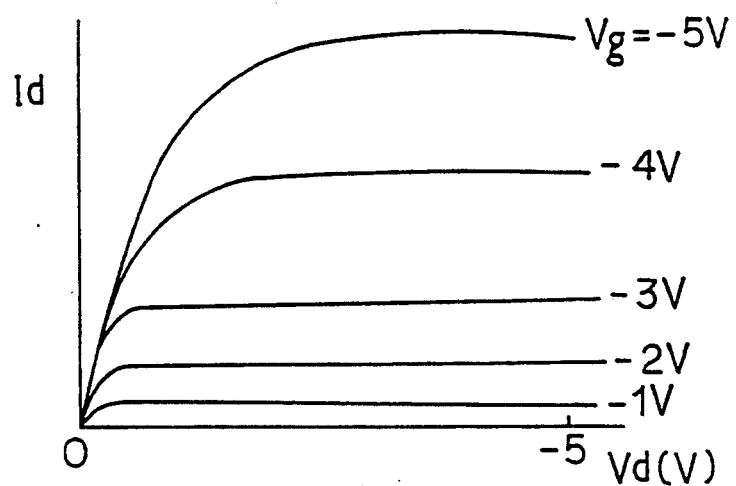
FIG. 46 is a representation showing the characteristic of the thin film transistor forming the conventional load transistor shown in FIG. 45.
Figure 47A:
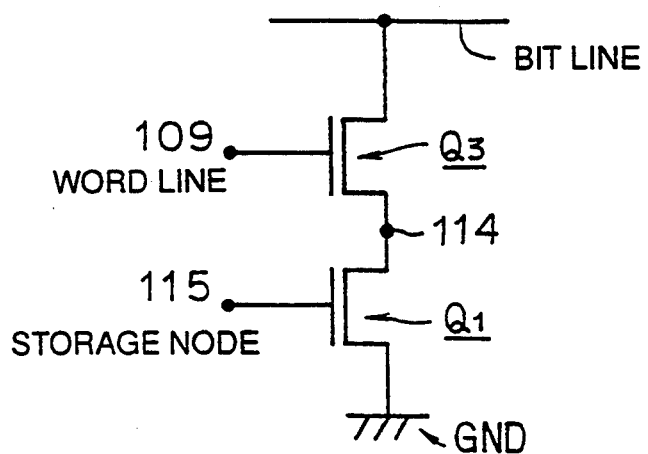
FIGS. 47A and 47B are equivalent circuit diagrams for use in illustration of reading operation from a conventional SRAM memory cell.
Figure 47B:
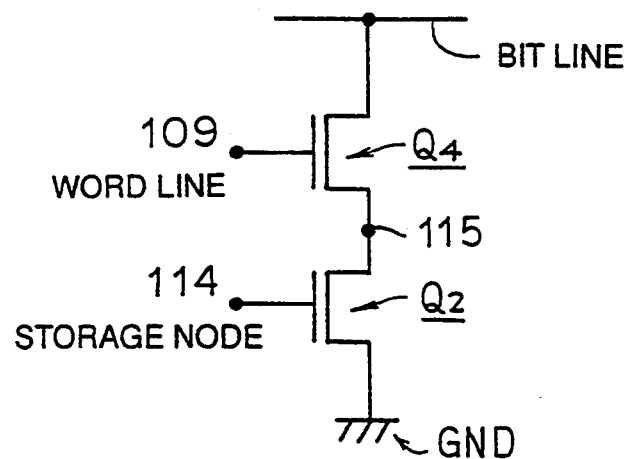
Figure 48:
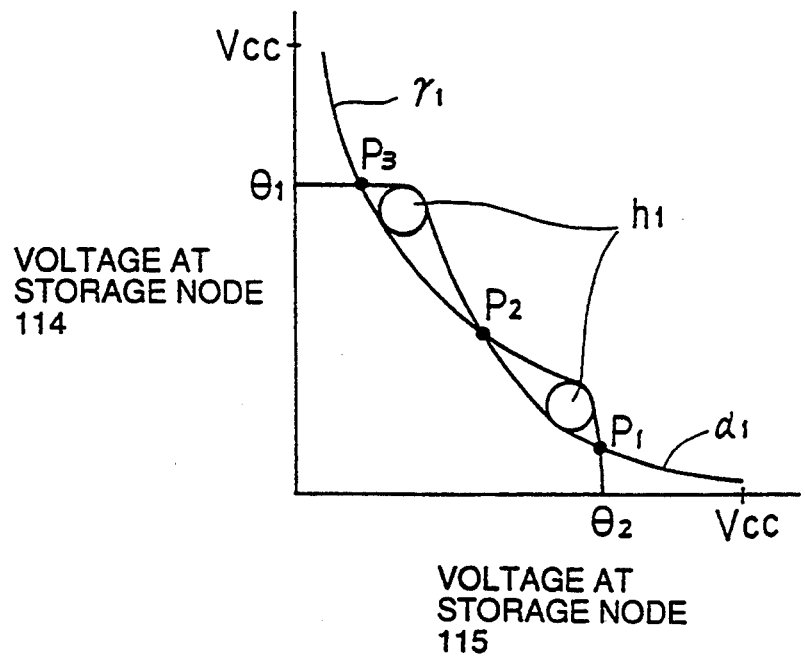
FIG. 48 is a representation showing characteristic curves in reading of data from a conventional memory cell.
Figure 49:
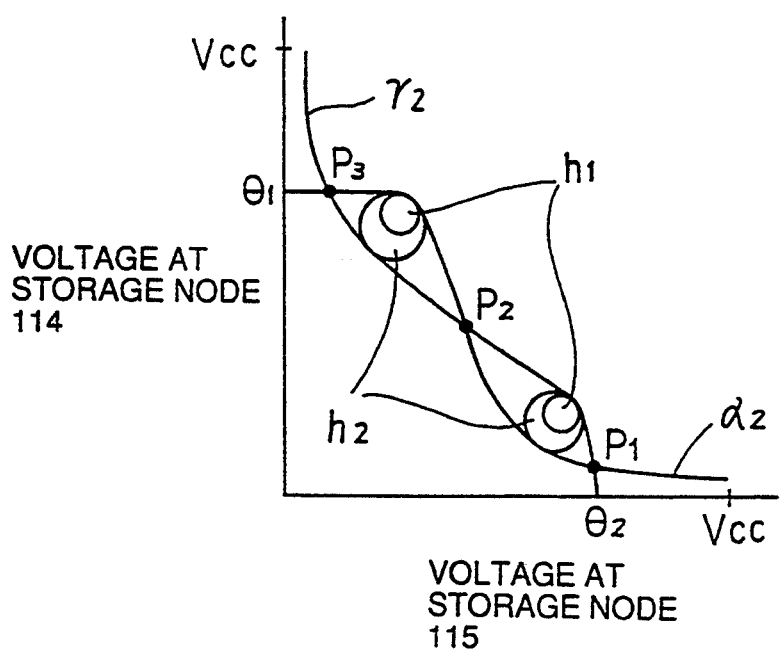
FIG. 49 is a representation showing characteristic curves in reading data showing the state of memory cell eyes when the driving capability ratio is increased.
Figure 50:
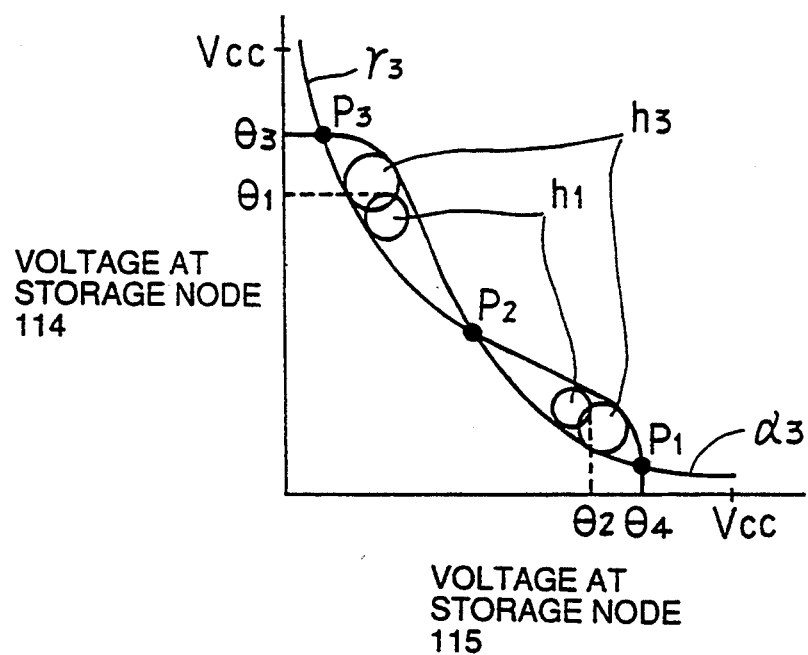
FIG. 50 is a representation showing characteristic curves in reading data showing the state of memory cell eyes when the threshold voltage $V_{th}$ of an access transistor is reduced.

FIG. 1 is a schematic cross sectional view showing in a cross section a memory cell structure for an SRAM according to a first embodiment of the invention corresponding to FIG. 44. FIG. 2A is an enlarged cross sectional view showing the structure of an access transistor indicated by region A in FIG. 1, while FIG. 2B is a schematic cross sectional view showing a driver transistor taken along line B—B in FIG. 1.

Referring to FIGS. 1, 2A and 2B, a pair of driver transistors $Q_1$, $Q_2$, and a pair of access transistors $Q_3$, $Q_4$ are formed on a main surface of a p well 20. Driver $Q_1$ has a drain region 25a and a source region 25b, and a gate electrode 23. Driver transistor $Q_2$ has a drain region 26a, a source region 26b, and a gate electrode 23. Driver transistors $Q_1$ and $Q_2$ have a gate insulating film formed of a silicon oxide film 27a and a silicon nitride film 27b piled thereon.

Access transistor $Q_3$ has a pair of source/drain regions 25d and a gate electrode 21. Access transistor $Q_4$ has a pair of source/drain regions 26d and a gate electrode 22. Access transistors $Q_3$ and $Q_4$ have a gate insulating film of a single layer silicon oxide film 27c.

Figure 43A:
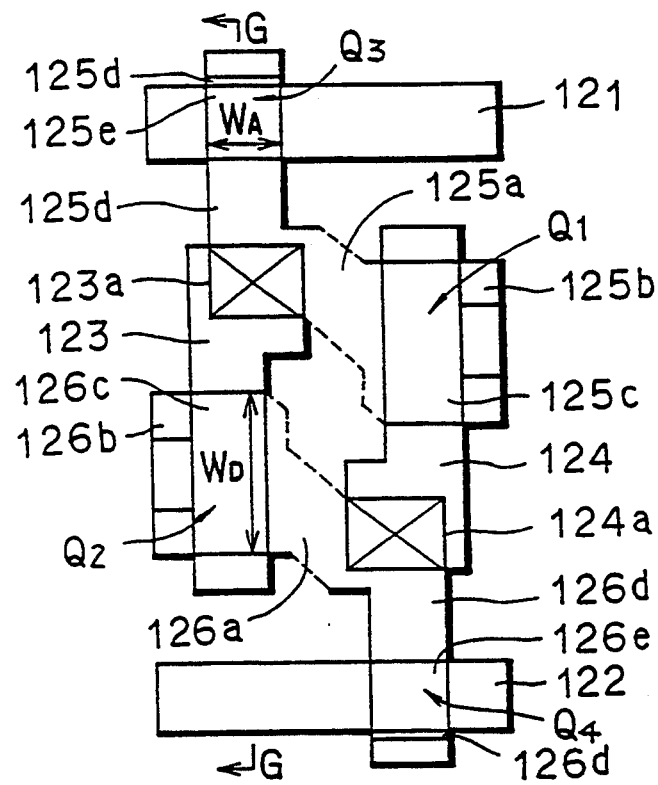
FIGS. 43A and 43B are plan views schematically showing a driver transistor, an access transistor, and a load transistor employed for a conventional SRAM memory cell structure.
Figure 43B:
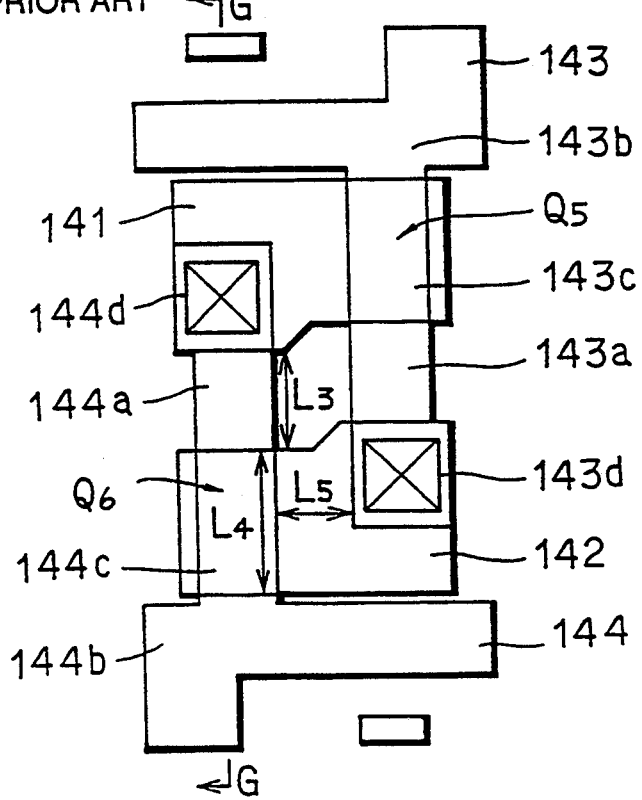

The memory cell structure of the SRAM according to the first embodiment of the invention is substantially identical to the memory structure of the conventional SRAM shown in FIGS. 43A, 43B, and 44 except for the structure of the above-described driver transistors $Q_1$, $Q_2$, and access transistors $Q_3$, $Q_4$, and therefore description thereof is omitted.

In the memory cell structure of the SRAM according to the embodiment, materials having different dielectric constants are used for the gate insulating films of driver transistors $Q_1$, $Q_2$, and the gate insulating film of access transistors $Q_3$, $Q_4$. Therefore, the driving capability ratio $\beta$ of driver transistor to access transistor can advantageously be increased. Hereinafter, this will be described by referring to Mitsumasa Koyanagi, SUB-MICRON DEVICE I Maruzen Kabushiki Kaisha, pp. 4-8.

The driving capability of a transistor is given as follows:

$$\frac{W}{L} \cdot \mu_{eff} \cdot C_{IN} \quad (1)$$

where W represents the gate width of a transistor, L the gate length, $\mu_{eff}$ the effective degree of movement of electrons on the surface, and $C_{IN}$ the capacitance of the gate insulating film per unit area. $C_{IN}$ is given by the following expression:

$$C_{IN} = \frac{\epsilon_{IN} \cdot \epsilon_0}{t_{IN}} \quad (2)$$

where $\epsilon_0$ is a vacuum dielectric constant, $\epsilon_{IN}$ is the relative dielectric constant of the gate insulating film, $t_{IN}$ is the thickness of the gate insulating film. As described, the driving capability ratio $\beta$ is represented as "driving capability of driver transistor"/"driving capability of access transistor". Accordingly, one method of increasing the driving capability ratio $\beta$ is to reduce the driving capability of an access transistor relative to the driving capability of a driver transistor. Reducing the relative dielectric constant of the gate insulating film of access transistors $Q_3$, $Q_4$ would reduce the driving capability of the access transistor from expressions (1) and (2).

From expressions (1) and (2), as the relative dielectric constant $\epsilon_{IN}$ of a gate insulating film is increased, the driving capability of the transistor is increased, while the relative dielectric constant $\epsilon_{IN}$ of a gate insulating film is reduced, the driving capability of the transistor is reduced. Accordingly, if a material having a smaller dielectric constant than the gate insulating film of driver transistors $Q_1$ and $Q_2$ is used for the gate insulating film of access transistors $Q_3$ and $Q_4$, the driving capability of access transistors $Q_3$, $Q_4$ relative to driver transistors $Q_1$, $Q_2$ can be reduced. As a result, the driving capability ratio $\beta$ can be increased.

In contrast, from the above-described expressions (1) and (2), as another approach the same material is used for the gate insulating film of driver transistors $Q_1$, $Q_2$, and the gate insulating film of access transistors $Q_3$, $Q_4$, only their film thicknesses $t_{IN}$ are made different, and then the driving capability ratio $\beta$ would be increased as a result. This approach is disclosed in Japanese Patent Laying-Open No. 63-211751. In this prior art document, only silicon oxide films are used for the gate insulating films of both of access transistors $Q_3$, $Q_4$ and driver transistors $Q_1$, $Q_2$. The thickness $t_{IN1}$ of the gate oxide film of access transistors $Q_3$, $Q_4$ is formed larger than the thickness $t_{IN2}$ of the gate oxide film of driver transistors $Q_1$, $Q_2$, and therefore a larger driving capability ratio $\beta$ is obtained.

According to the approach disclosed in the above-described prior art document, however, the larger the driving capability ratio $\beta$ is to be, the larger will be difference in the thicknesses ($t_{IN1} - t_{IN2}$) of the gate oxide films of driver transistors $Q_1$, $Q_2$ and access transistors $Q_3$, $Q_4$. Accordingly, difference in potential between the gate electrodes of driver transistors $Q_1$, $Q_2$ and access transistors $Q_3$, $Q_4$ is large. Therefore, failures in a pattern shape are encountered in patterning the upper layer of the gate electrodes by means of photolithography.

In this embodiment, by arbitrarily selecting materials having different dielectric constants for the gate insulating films, the film thickness of the gate insulating films of access transistors $Q_3$, $Q_4$, and driver transistors $Q_1$, $Q_2$ can be set to desired values. Accordingly, the film thicknesses of the gate insulating films of access transistors $Q_3$, $Q_4$, and driver transistors $Q_1$, $Q_2$ can be set identical. In such a case, failures in patterns on the upper layer of the gate electrodes by photolithography will hardly be encountered.

More specifically, as illustrated in FIGS. 1, 2A and 2B, the gate insulating film of access transistors $Q_3$, $Q_4$ remains to be silicon oxide film 27c, and a stacked structure of silicon oxide film 27a and silicon nitride film 27b is used for the gate insulating film of driver transistors $Q_1$, $Q_2$.

In this case, the relative dielectric constant of the silicon oxide film $\epsilon_{OX} \approx 3.8$-$3.85$, while the relative dielectric constant of the silicon nitride film $\epsilon_N \approx 7$ which is about twice as large as that of the silicon oxide film. The gate insulating film for driver transistors $Q_1$, $Q_2$ has a higher dielectric constant than access transistors $Q_3$, $Q_4$. As described above, in this embodiment, the driving capability ratio $\beta$ can effectively be increased by controlling the material and thickness of the insulating film.

Now, a manufacturing method will be described by way of illustrating driver transistor $Q_2$ and, access transistor $Q_3$ in FIGS. 1, 2A and 2B.

FIGS. 3A-8A and FIGS. 3B-8B are cross sectional views schematically showing, in the order of process, steps in a method of manufacturing an access transistor and a driver transistor used in the SRAM memory cell structure according to the first embodiment of the invention. FIGS. 3A-8A show the access transistor, while FIGS. 3B-8B show the driver transistor.

Figures 3A, 3B:
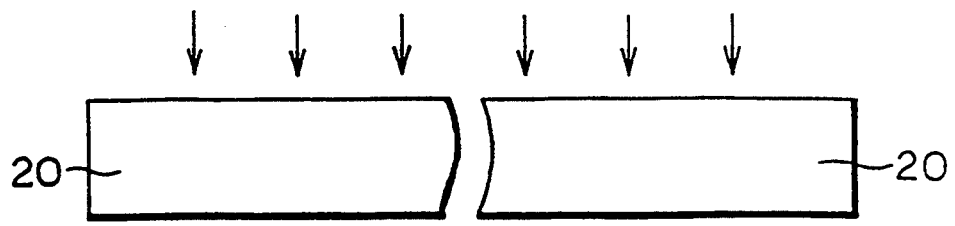

Referring to FIGS. 3A and 3B, a channel dope implantation is performed to p typewell 20. A threshold voltage $V_{th}$ *for the access transistor is determined by this implantation.*

Figures 4A, 4B:
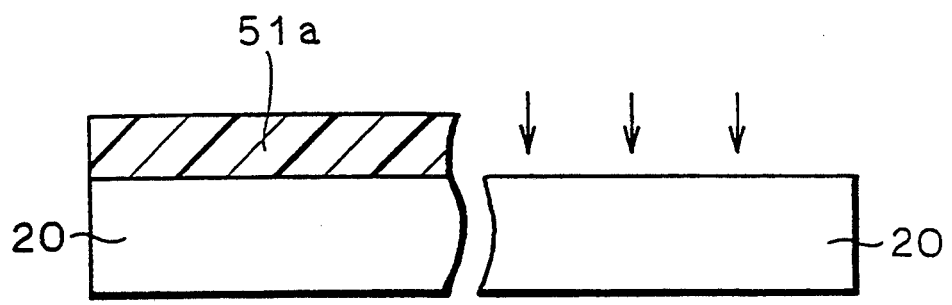

Referring to FIGS. 4A and 4B, photoresist 51a is formed on substrate 20 in an access transistor region (FIG. 4A), and then a channel dope implantation is performed to a driver transistor region (FIG. 4B) in well 20. These two channel dope implantations determine a threshold voltage for the driver transistor. Then, photoresist 51a is removed away.

In the process shown in FIGS. 3A and 3B, if an impurity is implanted to p type well 20 only into the access transistor region (FIG. 3A) covering only the driver transistor region (FIG. 3B) with resist for example and then implantation is performed to the driver transistor region (FIG. 4B) in p type well 20 by covering only the surface of access transistor region (FIG. 4A) with resist 51a in the process shown in FIGS. 4A and 4B, the threshold voltage for the driver transistor can be determined by a single channel dope implantation.

Figures 5A, 5B:
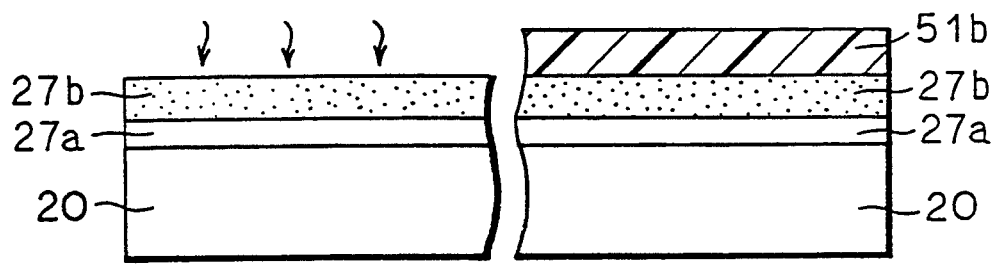

Referring to FIGS. 5A and 5B, a thermal oxidation treatment is performed on the entire surface of the wafer, and a silicon oxide film 27a is formed on the surface of the wafer. A silicon nitride film 27b is formed on the entire surface of silicon oxide film 27a. Then, photoresist 51b is formed only on silicon nitride film 27b in the driver transistor region (FIG. 5B). Silicon nitride film 27b and silicon oxide film 27a in the access transistor region (FIG. 5A) are sequentially subjected to wet or dry etching utilizing photoresist 51b as mask. Then, photoresist 51b is removed away.

Referring to FIGS. 6A and 6B, the above-described etching exposes the surface of p type well 20 in the access transistor region (FIG. 6A.)

Referring to FIGS. 7A and 7B, a silicon oxide film 27c is formed on p type well 20 in the access transistor region (FIG. 7A) by a thermal oxidation treatment. In the thermal oxidation treatment, silicon nitride film 27b in the driver transistor region (FIG. 7B) is little oxidized. Accordingly, silicon oxide film 27c is formed only in the access transistor region (FIG. 7A).

Referring to FIGS. 8A and 8B, a polycrystalline silicon film is formed on the entire surface of the wafer 20. The polycrystalline silicon film, silicon nitride film 27b, and silicon oxide films 27c, 27a are sequentially etched away by means of photolithography and etching, and gate electrodes 21, 23, and gate insulating films 27c, 27a, 27b are formed. Then, an impurity is implanted using gate electrodes 21, 23, and an isolation oxide film (not shown) as mask. Thus, source/drain regions 25d, 26a, 26b as illustrated in FIG. 2 are formed.

Assuming that the thickness of silicon oxide film 27c is $t_{OX2}$, the thickness of silicon oxide film 27a $t_{OX1}$, and the thickness of silicon nitride film 27b $t_N$, the driving capability ratio $\beta$ can be increased provided that silicon oxide films 27a, 27c, and silicon nitride film 27b are formed satisfying the following expression:

$$\frac{\epsilon_{OX}}{t_{OX2}} < \frac{1}{\frac{t_{OX1}}{\epsilon_{OX}} + \frac{t_N}{\epsilon_N}}$$

Figure 9A:
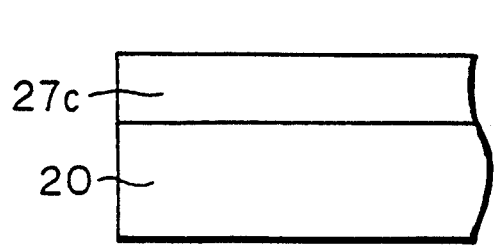
FIGS. 9A and 9B are sectional views showing manufacturing methods of the access transistor and driver transistor employed for the SRAM memory cell structure according to the first embodiment of the invention when the material of the gate insulating films are changed.
Figure 9B:
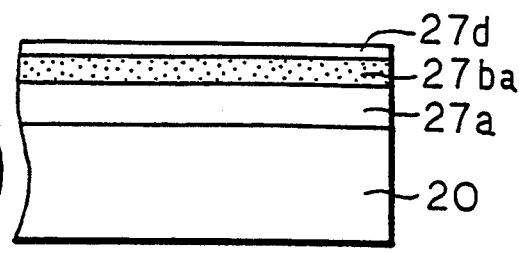
Figure 10A:
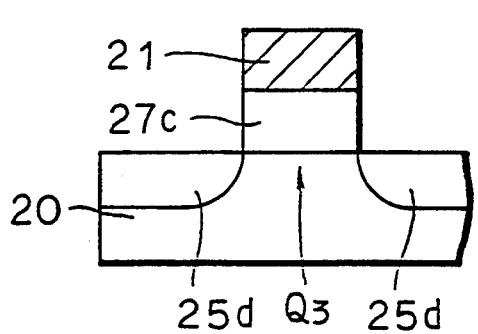
FIGS. 10A and 10B are sectional views schematically showing the structure of the access transistor and driver transistor corresponding to FIGS. 9A and 9B.

It is noted that in the above-described embodiment, silicon nitride film 27b is used as a material having a different dielectric constant, but any other insulating film may be used. In this case, not only silicon oxide film 27c is formed on substrate 20 in the access transistor region (FIG. 9A) as shown in FIGS. 9A and 9B but also silicon oxide film 27d is formed on the surface of insulating film 27ba by a thermal oxidation treatment in the process as illustrated in FIGS. 6A and 6B. Then, post-treatment as described above is performed to form access transistor $Q_3$ and driver transistor $Q_2$ shown in FIGS. 10A and 10B. At the time, assuming that the thickness of insulating film 27ba is $t_a$, dielectric constant $\epsilon_a$, and the thickness of silicon oxide film 27d $t_{OX3}$, each gate insulating film needs only be formed satisfying the following expression:

$$\frac{\epsilon_{OX}}{t_{OX2}} < \frac{1}{\frac{t_{OX1}}{\epsilon_{OX}} + \frac{t_a}{\epsilon_a} + \frac{t_{OX3}}{\epsilon_{OX}}}$$

Figure 10B:
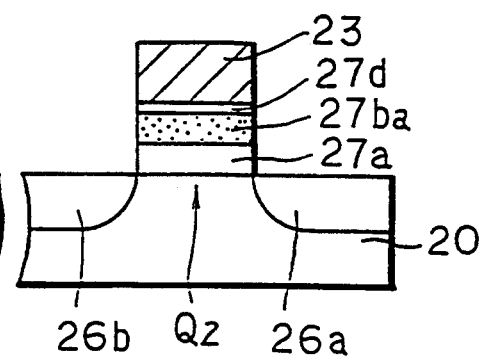

Though in FIGS. 2B and 10B the gate insulating film of the driver transistor is formed of a plurality of layers, it may be simply formed of a single insulating film layer having a dielectric constant different from the silicon oxide film.

Furthermore, the device may be arranged so that the gate insulating film of the access transistor is formed of a plurality of layers, while the gate insulating film of the driver transistor is formed of a single layer.

Referring to FIGS. 11A and 11B, a stacked layer of a silicon oxide film 27e and a silicon nitride film 27f, for example, may be used for the gate insulating film of access transistor $Q_3$, while a single layer of silicon oxide film 27g may be used for the gate insulating film of driver transistor $Q_4$. A manufacturing method when access transistor $Q_3$ and driver transistor $Q_4$ are thus structured will be described.

FIGS. 12A-14A and FIGS. 12B-14B are cross sectional views schematically showing in the order of the process a manufacturing method of the access transistor and driver transistor shown in FIGS. 11A and 11B.

Referring to FIGS. 12A and 12B, a channel dope implantation is performed to p type well 20 in order to determine a threshold voltage for each transistor. This channel dope implantation is substantially identical to the process illustrated in conjunction with FIGS. 3A and 3B, and FIGS. 4A and 4B, and therefore the description thereof is omitted. After the channel dope implantation, a silicon oxide film 27e and a silicon nitride film 27f are sequentially stack upon each other on the entire surface of p type well 20. Photoresist 51c is formed on the surface of silicon nitride film 27f in an access transistor region (FIG. 12A). Silicon nitride film 27f and silicon oxide film 27e in a driver transistor region (FIG. 12B) are sequentially etched away using photoresist 51c as mask.

Referring to FIGS. 13A and 13B, this step of etching away exposes the surface of p type well 20 in the driver transistor region (FIG. 13B).

Referring to FIGS. 14A and 14B, a silicon oxide film 27g is formed on p type well 20 in the driver transistor region (FIG. 14B) by a thermal oxidation treatment. It is noted that since silicon nitride film 27f is hardly oxidized at the time, and little silicon oxide film is formed on silicon nitride film 27f in the access transistor region (FIG. 14A). Then, a polycrystalline silicon film is formed on the entire surface of the silicon substrate. The polycrystalline silicon film is patterned into a desired form, and then an impurity is implanted to form access transistor $Q_3$ and driver transistor $Q_2$ as illustrated in FIGS. 11A and 11B.

In the structure shown in FIGS. 11A and 11B, assuming that the thickness of silicon oxide film 27e is $t_{OX1}$, the thickness of silicon nitride film 27f is $t_N$, and the thickness of silicon oxide film 27g is $t_{OX2}$, each gate insulating film is formed satisfying the following expression:

$$\frac{1}{\frac{t_{OX1}}{\epsilon_{OX}} + \frac{t_N}{\epsilon_N}} < \frac{\epsilon_{OX}}{t_{OX2}}$$

Also in FIGS. 2A and 2B and FIGS. 10A and 10B, the gate insulating film of a driver transistor is formed of a plurality of layers, it may simply be formed of a single layer of insulating film having a dielectric constant different from the silicon oxide film.

Figures 15A, 15B:
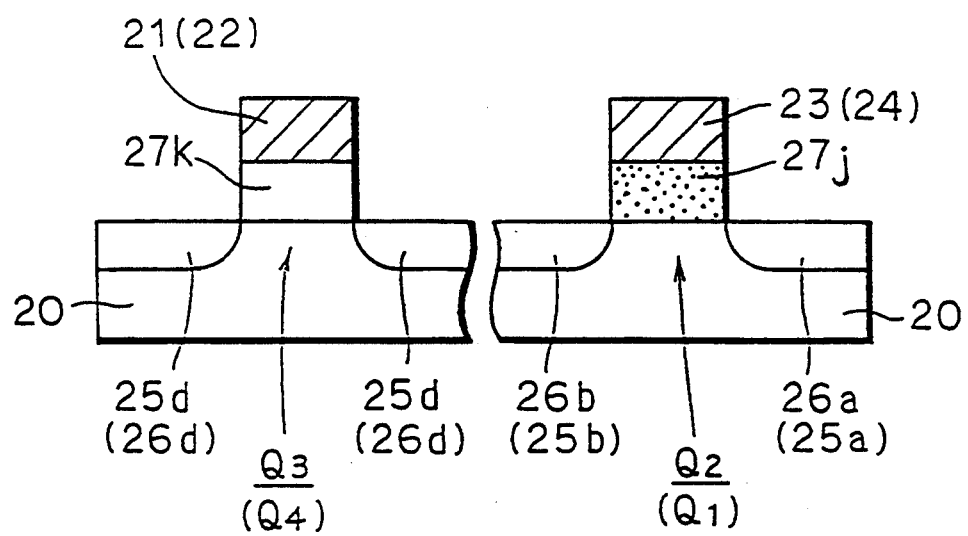
FIGS. 15A and 15B are sectional views schematically showing the structure of an access transistor and a driver transistor each having a gate insulating film formed of a single layer.

Referring to FIG. 15, for example, gate insulating film 27k for access transistors $Q_3$, $Q_4$ may be formed of a single layer of silicon oxide film and gate insulating film 27j for driver transistors $Q_1$, $Q_2$ may be formed of a single layer of silicon nitride film.

In this case, when the thickness $t_{IN1}$ of silicon nitride film 27j and the thickness $t_{IN2}$ of oxide film 27k are each 100 Å, the dielectric constants of the silicon nitride film and the silicon oxide film are $\epsilon_N \approx 7$ and $\epsilon_{OX} \approx 3.8$, respectively, and the driving capability ratio $\beta$ will be $7/3.8 \approx 1.84$ (times) as large.

If another material having a dielectric constant different from the silicon oxide film is used in place of silicon nitride film 27f, the state shown in FIGS. 16A and 16B is attained by a thermal oxidation treatment in the process shown in FIGS. 13A and 13B. More specifically, silicon oxide film 27g is formed on p type well 20 in the driver transistor region (FIG. 15B) by thermal oxidation treatment, while silicon oxide film 27h is formed on the surface of an insulating film 27fa in the access transistor region. Then, post-treatment the same as described above is performed to form access transistor $Q_3$ and driver transistor $Q_2$ shown in FIGS. 16A and 16B. In the structure as illustrated in FIGS. 17A and 17B, assuming that the thickness of insulating film 27fa is $t_a$, relative dielectric constant is $\epsilon_a$, and the thickness of silicon oxide film 27h is $t_{OX3}$, each gate insulating film is expected to be formed satisfying the following expression:

$$\frac{1}{\frac{t_{OX1}}{\epsilon_{OX}} + \frac{t_a}{\epsilon_a} + \frac{t_{OX3}}{\epsilon_{OX}}} < \frac{\epsilon_{OX}}{t_{OX2}}$$

In the above-described embodiment, silicon oxide films and silicon nitride films are mainly employed for the gate insulating film, and a film having an insulating characteristic and a different dielectric constant can be used for the gate insulating film. Also in the above-described embodiment, although access transistor $Q_3$ and driver transistor $Q_2$ are described by way of illustration, the above-structure can be employed for access transistor $Q_4$ and driver transistor $Q_1$.

A ferroelectric film or a paraelectric film may be used for each gate insulating film. Such a ferroelectric film includes a PT (relative dielectric constant=from 200 to 400), a PZT (relative dielectric constant=from 300 to 2000) and a PLZT (relative dielectric constant=from 300 to 1500). The paraelectric film includes (Ba, Sr)TiO$_3$ (relative dielectric constant=from 250 to 500), SrTiO₃ (relative dielectric constant=from 200 to 250), and Ta₂O₅ (relative dielectric constant=22).

Embodiment 2

Now, the structure of an access transistor with a different threshold voltage $V_{th}$ according to a second embodiment will be described.

As described above, a method of reducing the threshold voltage $V_{th}$ of access transistor may be employed as a method of stabilizing reading operation by enlarging the memory cell eye.

Figures 18A, 18B:
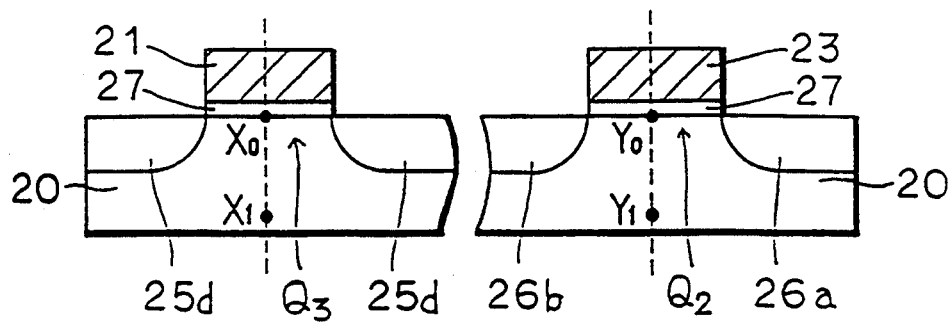
FIGS. 18A and 18B are sectional views schematically showing the structure of an access transistor and a driver transistor.

FIGS. 18A and 18B are cross sectional views schematically showing the structure of an access transistor and a driver transistor. Referring to FIGS. 18A and 18B, access transistor Q₃ has source/drain regions 25d, and a gate electrode 21 formed on the channel region with a gate insulating film 27 therebetween. Driver transistor Q₂ has a drain region 26a and a source region 26b, and a gate electrode 23 formed on the channel region with a gate insulating film 27 therebetween.

Figure 19:
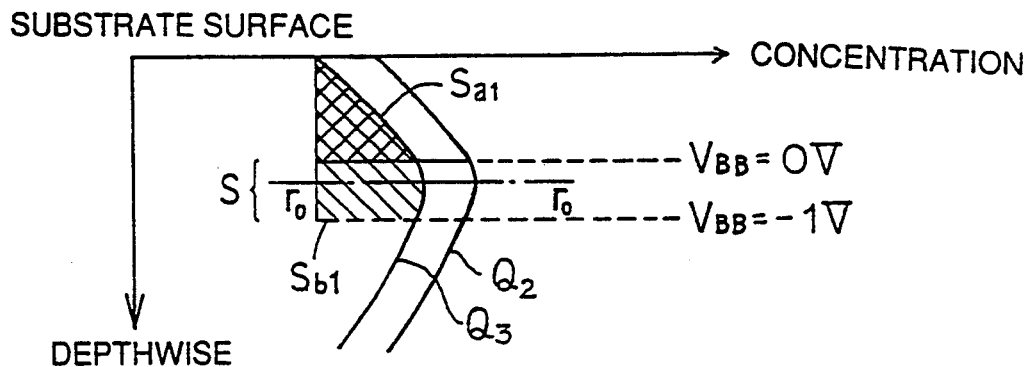
FIG. 19 is a representation showing an impurity concentration distribution along $X_0$-$X_1$ in FIG. 18A and an impurity concentration distribution along $Y_0$-$Y_1$ in FIG. 18B in a comparison example.

A possible approach to reduce the threshold voltage $V_{th}$ of access transistor Q₃ is to reduce the amount of an impurity implanted into the channel region. FIG. 19 is a representation showing impurity concentrations corresponding to depth positions along line X₀-X₁ in FIG. 18A and line Y₀-Y₁ in FIG. 18B. Referring to FIG. 19, reducing the impurity concentration in the depthwise direction of access transistor Q₃ compared to driver transistor Q₂ results in reduction of the threshold voltage $V_{th}$ of the access transistor. This somewhat stabilizes the reading characteristic as a result.

In recent years, however, demands for high density integration have increased in the field of SRAMs, and power supply voltage (Vcc) has been reduced as integration density has increased. More specifically, reducing the power supply voltage which has been 5 V to 3 V has been contemplated.

In the environment in which the power supply voltage tends to be reduced as such, increase of the threshold voltage of an access transistor due to a back gate effect can not be ignored. Herein, the back gate effect indicates an effect created when bias voltage is applied to the source and substrate in an MOS transistor, and the depletion layer between the channel and the substrate is increased by the amount of the bias voltage to increase fixed charge (ionized acceptor or donor). Fixed charge in the depletion layer increases by the amount corresponding to the expansion of the depletion layer and the threshold voltage $V_{th}$ increases corresponding to the amount of increase of the fixed charge.

In the arrangement of the access transistor shown in FIG. 19, if increase of the threshold voltage $V_{th}$ due to the backgate effect described above is to be prevented, current leakage is generated as follows.

More specifically, in the structure of the access transistor shown in FIG. 19, in order to reduce the threshold voltage $V_{th}$ in the state in which bias due to the backgate effect is applied, fixed charge in the depletion layer should be reduced. In this case, however, fixed charge in the depletion layer without bias due to the backgate effect being applied is greatly reduced. Accordingly, the threshold voltage $V_{th}$ of the access transistor at back bias voltage=0 V becomes low, resulting in current leakage.

Figure 20:
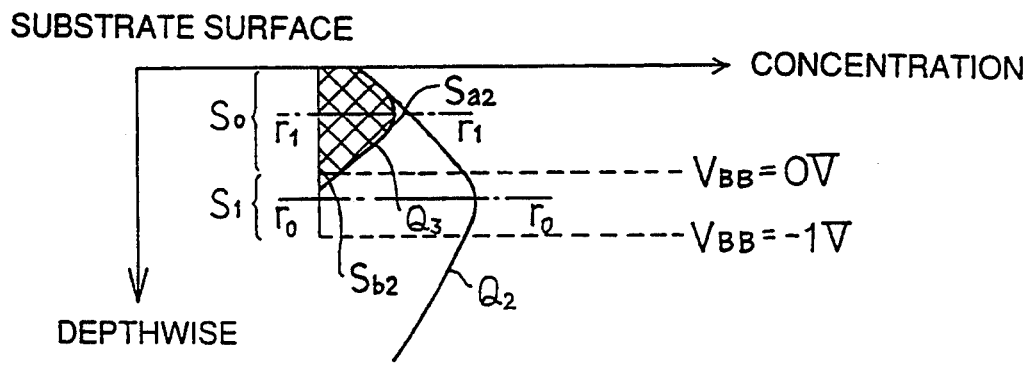
FIG. 20 is a representation showing an impurity concentration distribution along $X_0$-$X_1$ in FIG. 18A and an impurity concentration distribution along $Y_0$-$Y_1$ in FIG. 18B according to a second embodiment of the invention.

In contrast, in the access transistor employed for the memory cell structure of the SRAM according to the second embodiment of the invention, the amount of impurity implanted into the channel region is reduced, and the energy is reduced as well. Accordingly, as illustrated in FIG. 20, the impurity concentration peak (chain dotted line r₁—r₁) is at a relatively shallow position from the substrate surface as compared to the case of driver transistor Q₂. Therefore, the amount of fixed charge newly generated (the amount of impurity distributed in region S₁) is small even if bias voltage is applied and the depletion layer expands towards the lower side of channel region, and increase of the threshold voltage $V_{th}$ due to the substrate bias effect is restrained. Now, this will be described in more detail.

FIGS. 21A, 21B, 21C, and 21D are representations for use in illustration of the reasons why increase of the threshold voltage $V_{th}$ is restrained in the improved access transistor in view of the back gate effect. Referring to FIGS. 21A, 21B, 21C and 21D, region S_{a1} and region S_{b1} each represent the amount of an impurity from the substrate surface of access transistor Q₃ of comparison example shown in FIG. 19 to the region in which the depletion layer is formed. Region S_{a2} and region S_{b2} each represent the amount of an impurity from the substrate surface of the improved access transistor Q₃ according to the embodiment shown in FIG. 20 to the region in which the depletion layer is formed. If bias voltage is not applied ($V_{BB}$=0 V), the amount of impurity S_{a1} (FIG. 21A) in the case of the comparison example simply reducing the amount of implantation is substantially equal to the amounts of impurity S_{a2} (FIG. 21B) in the case of this embodiment with the implantation energy reduced in addition. More specifically, the amounts of fixed charge of the comparison example (FIG. 21A) and the improved example (FIG. 21B) are substantially the same. Therefore, in this state free from the back gate effect, the threshold voltages Vth of access transistors in the comparison example (FIG. 21A) and the embodiment (FIG. 21B) are substantially identical.

Figures 21A, 21B:
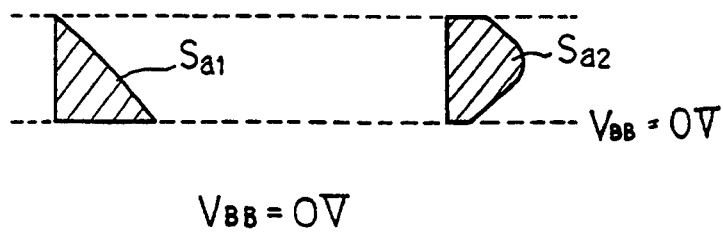
FIGS. 21A and 21B and FIGS. 21C and 21D are representations illustrating that threshold voltage $V_{th}$ is more reduced in the second embodiment of the invention than the comparison example when a backgate effect is provided.
Figures 21C, 21D:
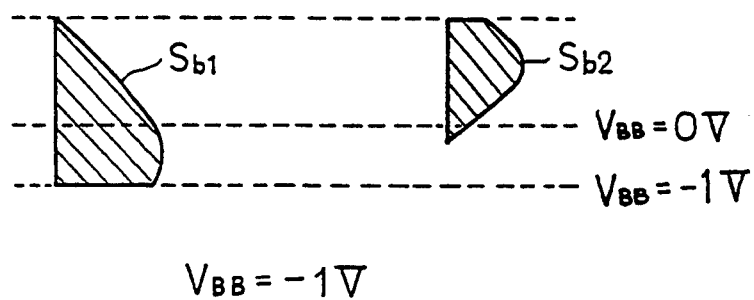

However, when bias voltage is applied (at $V_{BB}$=−1 V), the depletion layer expands toward the lower side of the channel region, and the amount of newly generated fixed charge is larger in the comparison example (FIG. 21C) than in the embodiment (FIG. 21D). Therefore, the threshold voltage $V_{th}$ of access transistor Q₃ of the embodiment reducing both the amount of impurity implanted and implantation energy can be more reduced when the back gate effect is present.

The back biasing effect upon threshold voltage $V_{th}$ is given as follows:

$$V_{th} = V_{th0} + k\sqrt{|V_B| + 2\phi_F}$$

$V_B$ is back bias voltage, $V_{th0}$ is threshold voltage at $V_B$=0, and $\phi_F$ is Fermi potential.

Comparison of the case with channel dope energy of 50 keV in a dose amount of 5×10¹²/cm⁻² and the case with channel dope energy of 35 keV in a dose amount of 3.5×10¹²/cm⁻² is set forth in the following table:

| Channel Dope Energy | $V_{th0}$ | k | $V_{th}$ at $V_B$ = −1 V |
|---|---|---|---|
| 50 keV | 0.75 V | 0.79 | 1.137 V |
| 35 keV | 0.75 V | 0.657 | 1.072 V |

Note that the result is obtained at $2\phi_F$=0.6.

As can be seen from the result set forth in the table, as the channel energy is smaller, $V_{th}$ with back biasing effect applied can be reduced even with $V_{th0}$ being the same. Therefore, the smaller k is, the smaller will be the back biasing effect.

It is noted that the gate length of access transistor $Q_3$ is generally set larger than that of driver transistor $Q_2$. Therefore, in access transistor $Q_3$, the punch through margin becomes larger than in driver transistor $Q_2$. Accordingly, even if the concentration peak of an impurity implanted into the channel region of access transistor $Q_3$ is set at a relatively shallow position, a punch through can be restrained from being generated at a relatively deep portion of the substrate.

Now, a method of manufacturing an access transistor and a driver transistor according to an improved example giving the impurity concentration distribution shown in FIG. 20 will be described.

FIGS. 22A and 22B–FIGS. 24A and 24B are schematic sectional views showing in the order of steps a method of manufacturing an access transistor and a driver transistor used for an improved SRAM memory cell according to a second embodiment of the invention.

Figures 22A, 22B:
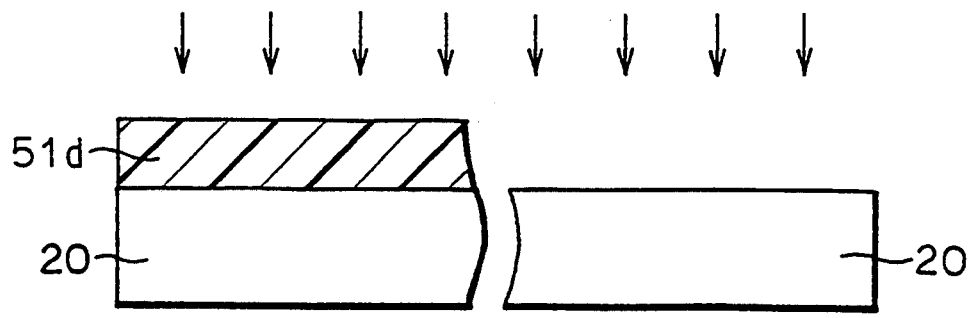

Referring to FIGS. 22A and 22B, photoresist 51d is formed on a p type well 20 in an access transistor region (FIG. 22A). An impurity is implanted into p type well 20 in a driver transistor region (FIG. 22B) using the photoresist 51d as mask with an implantation energy of 50 keV. Then, the photoresist 51d is removed away.

Figures 23A, 23B:
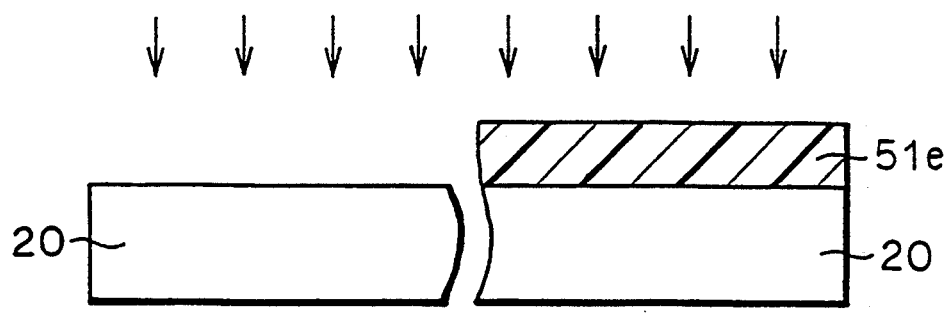

Referring to FIGS. 23A and 23B, photoresist 51e is formed on p type well 20 in a driver transistor region (FIG. 23B). Using photoresist 51e as mask, an impurity is implanted into p type well 20 in the access transistor region (FIG. 23B) with an implantation energy of 20 keV. Then, the photoresist 51e is removed away.

Figures 24A, 24B:
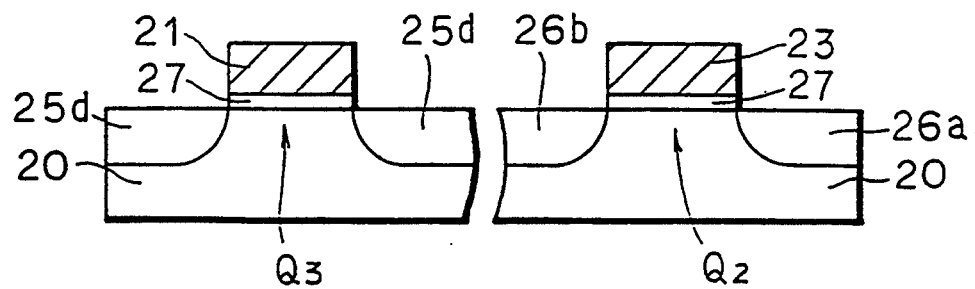

Referring to FIGS. 24A and 24B, gate electrodes 21 and 23 are formed on p type well 20 each with a gate insulating film 27 therebetween. Source/drain regions 25d, 26a, and 26b are formed by implanting an impurity utilizing these gate electrodes 21, 23 or the like as mask. Thus, access transistor $Q_3$ and driver transistor $Q_2$ of the embodiment are formed.

It is noted that although in the description of the above embodiment transistor $Q_3$ and driver transistor $Q_2$ are illustrated by way of example, the structure may be applied to access transistor $Q_4$ and driver transistor $Q_1$.

Embodiment 3

Now, the structure of a load transistor used for an SRAM memory cell structure according to a third embodiment of the invention will be described.

Figure 25A:
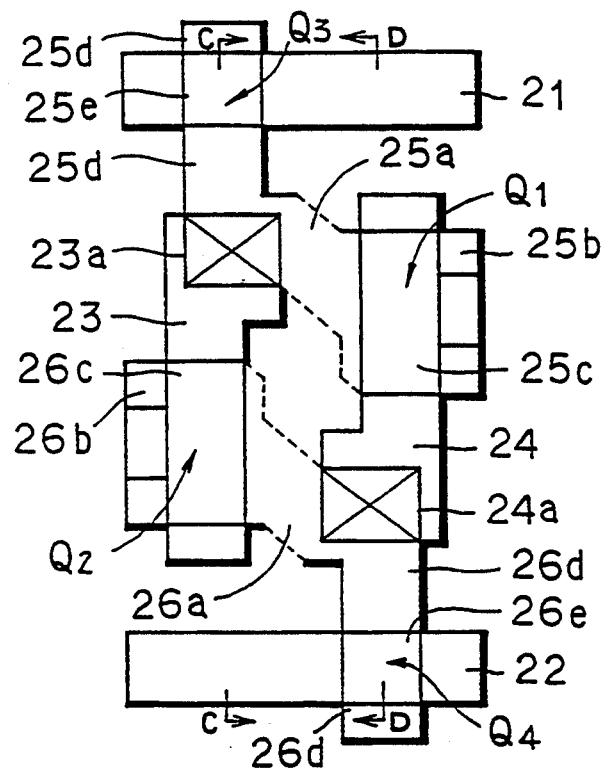
FIGS. 25A and 25B are plan views schematically showing the structure of an access transistor, a driver transistor, and a load transistor employed for an SRAM memory cell structure according to a third embodiment of the invention.
Figure 25B:
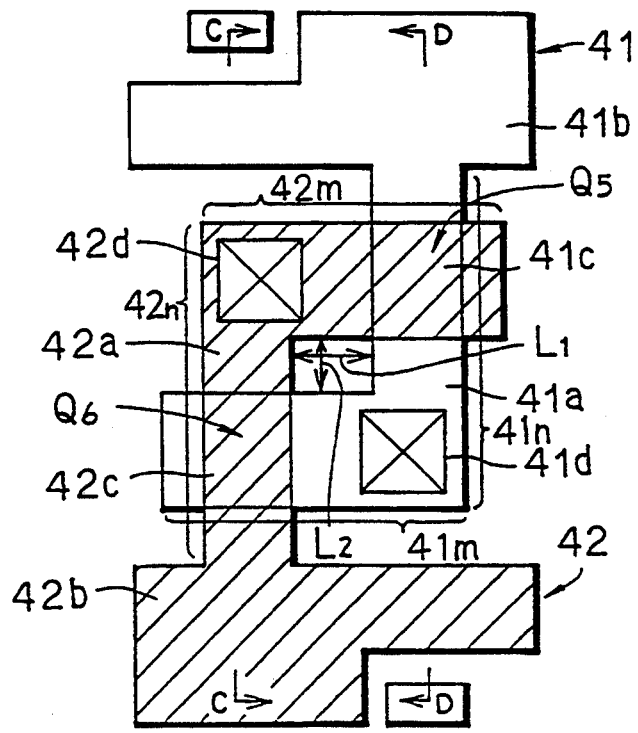
Figure 26A:
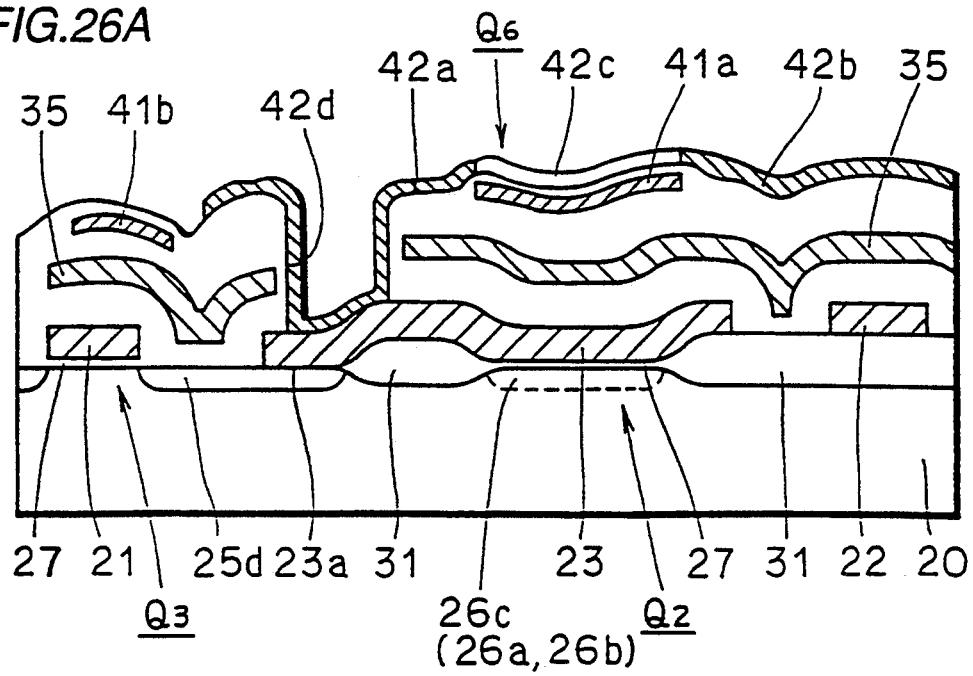
FIGS. 26A and 26B are schematic sectional views taken along lines C—C and D—D in FIGS. 25A and 25B.
Figure 26B:
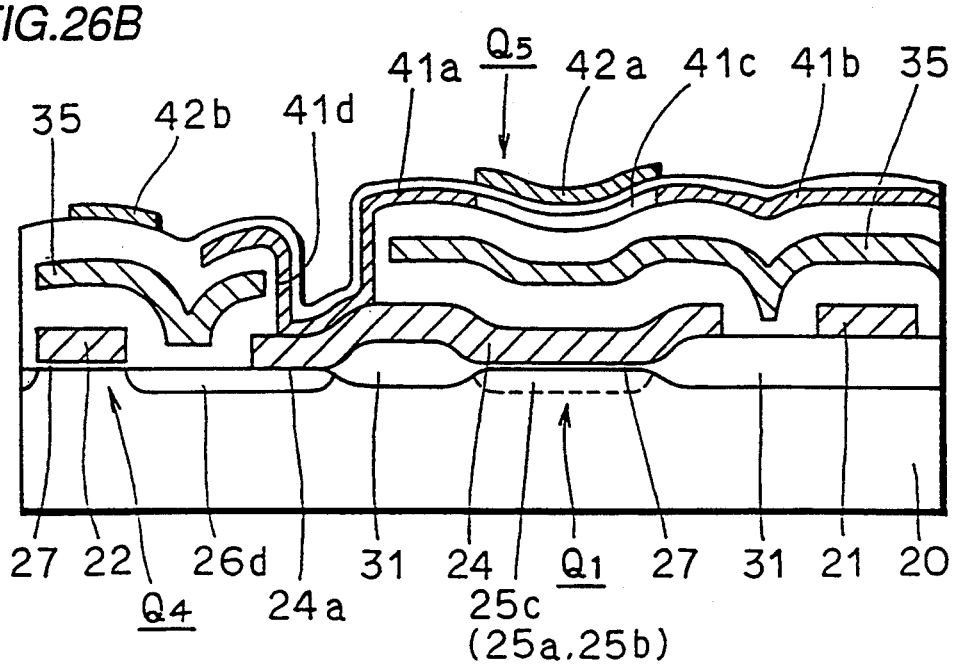

FIGS. 25A and 25B are plan views schematically showing the SRAM memory cell structure according to the third embodiment of the invention divided into two stages from the bottom layer of the substrate surface. More specifically, FIG. 25A illustrates driver transistors $Q_1$, $Q_2$, and access transistors $Q_3$, $Q_4$ formed on the substrate, while FIG. 25B illustrates the structure of load transistors $Q_5$, $Q_6$. FIG. 26A is a schematic cross sectional view taken along line C—C in FIGS. 25A and 25B, while FIG. 26B is a schematic cross sectional view taken along line D—D in FIGS. 25A and 25B.

Referring to FIGS. 25A, 25B, 26A and 26B, in the SRAM memory cell structure according to the third embodiment of the invention, a pair of driver transistors $Q_1$, $Q_2$ and a pair of access transistors $Q_3$, $Q_4$ are formed on a main surface of p type well 20. Driver transistor $Q_1$ has a drain region 25a, a source region 25b, and a gate electrode 24. Driver transistor $Q_2$ has a drain region 26a, a source region 26b, and a gate electrode 23. A gate insulating film 27 is formed under each of the gate electrodes 24 and 23 of driver transistors $Q_1$ and $Q_2$.

Access transistor $Q_3$ has a pair of source/drain regions 25d, and a gate electrode 21. Access transistor $Q_4$ has a pair of source/drain regions 26d, and a gate electrode 22. Access transistors $Q_3$ and $Q_4$ each have a gate insulating film 27 under gate electrodes 21 and 22.

These transistors are formed of n type MOS transistors each having source/drain regions formed on the main surface of p type well 20. The gate electrode 23 of driver transistor $Q_2$ is connected to one of source/drain regions 25d of access transistor $Q_3$ and the drain region 25a of driver transistor $Q_1$ through a contact portion 23a. The gate electrode 24 of driver transistor $Q_1$ is connected to one of the source/drain regions 26d of access transistor $Q_4$ and the drain region 26a of driver transistor $Q_2$ through a contact portion 24a.

Referring to FIGS. 25B, 26A and 26B, the pair of load transistors $Q_5$, $Q_6$ are formed by stacking two layers of polycrystalline silicon films 41 and 42 upon each other in a desired form. First polycrystalline silicon film 41 has strip portions 41m and 41n extending in a prescribed width. Second polycrystalline silicon film 42 has strip portions 42m and 42n extending in a prescribed width. Load transistor $Q_5$ has a drain region 41a and a source region 41b having a channel region 41c therebetween in the strip portion 41n of first polycrystalline silicon film 41, and a gate portion 42a formed opposite to channel region 41c in the strip portion 42m of second polycrystalline silicon film 42. Load transistor $Q_6$ has a drain region 42a and a source region 42b formed having a channel region 42c therebetween in the strip portion 42n of second polycrystalline film 42, and a gate portion 41 formed opposing to channel region 42c in the strip portion 41m of first polycrystalline silicon film 41.

A portion 42a to be the gate portion of load transistor $Q_5$ is integrally connected to the drain region 42a of load transistor $Q_6$. A portion 41a to be the gate of load transistor $Q_6$ is integrally connected to the drain region 41a of load transistor $Q_5$. The drain region 41a of load transistor $Q_5$ is connected to the gate electrode 24 of underlying driver transistor $Q_1$ through a contact hole 41d. The drain region 42a of load transistor $Q_6$ is connected to the gate electrode 23 of underlying driver transistor $Q_2$ through a contact hole 42d. Load transistor $Q_5$ thus constitutes a so-called top gate type thin film transistor, while load transistor $Q_6$ constitutes a so-called bottom gate type thin film transistor.

In the intermediate layer between the above-described driver transistor $Q_1$, $Q_2$ and access transistor $Q_3$, $Q_4$, and thin film transistors $Q_5$, $Q_6$, a tungsten silicide layer 35 to be GND line is formed.

Now, a method of manufacturing a load transistor used for the SRAM memory structure as illustrated in FIGS. 25A, 25B, 26A, and 26B will be described in conjunction with cross sectional views corresponding to FIGS. 26A and 26B.

FIGS. 27A–31A and FIGS. 27B–31B are schematic cross sectional views showing in the order of the process a manufacturing method of the load transistor used for the SRAM memory cell according to the second embodiment of the invention in cross sections corresponding to FIGS. 26A and 26B.

Figure 27A:
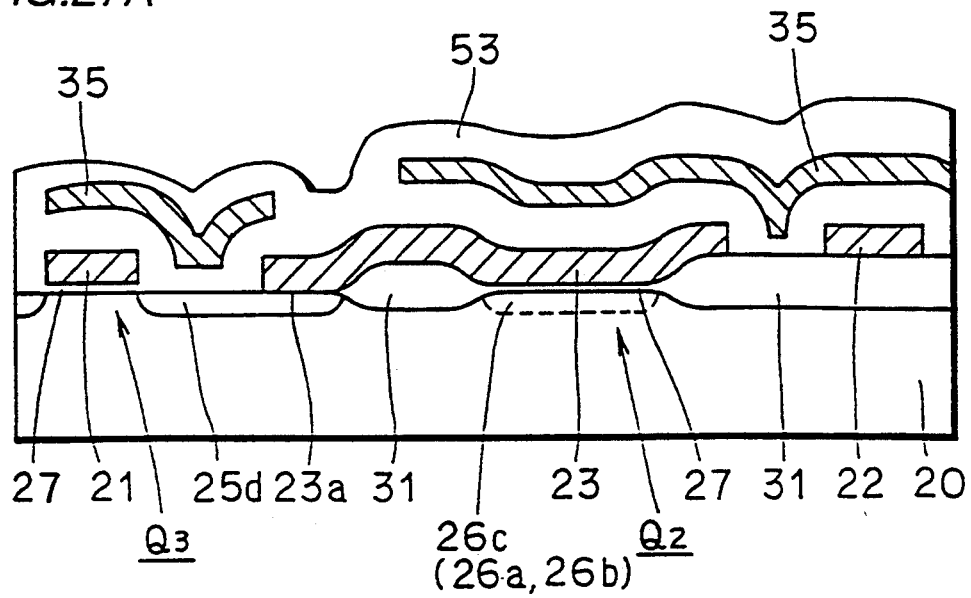
Figure 27B:
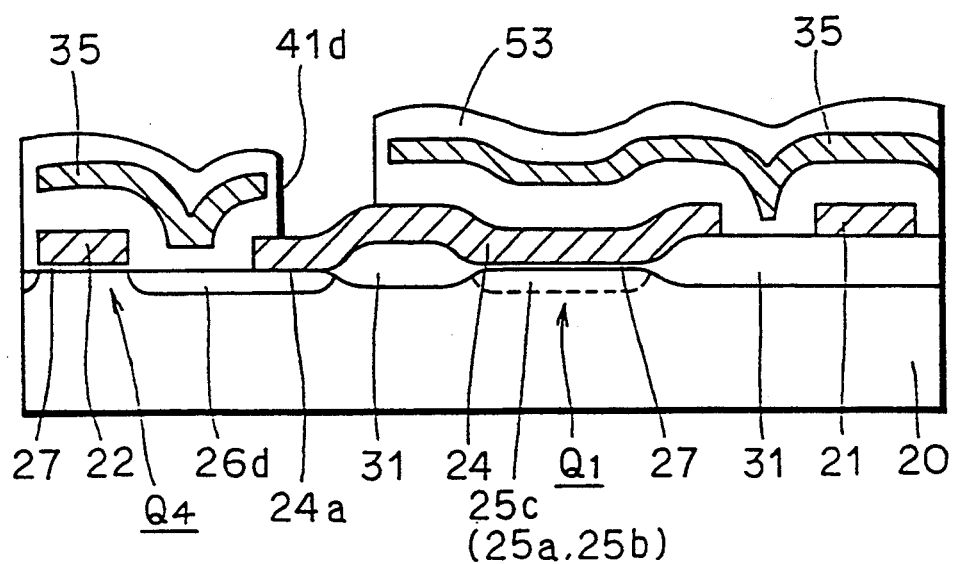

Referring to FIGS. 27A and 27B, driver transistors $Q_1$, $Q_2$, access transistors $Q_3$, $Q_4$ and overlying tungsten silicide layer 35 are formed on a main surface of p type well 20. An insulating film 53 is formed to cover the surface of p type well 20. Then, a contact hole 41d is formed in the insulating film by means of photolithography and etching. Part of the surface of gate electrode 24 of driver transistor $Q_1$ is exposed from contact hole 41d.

Figure 28A:
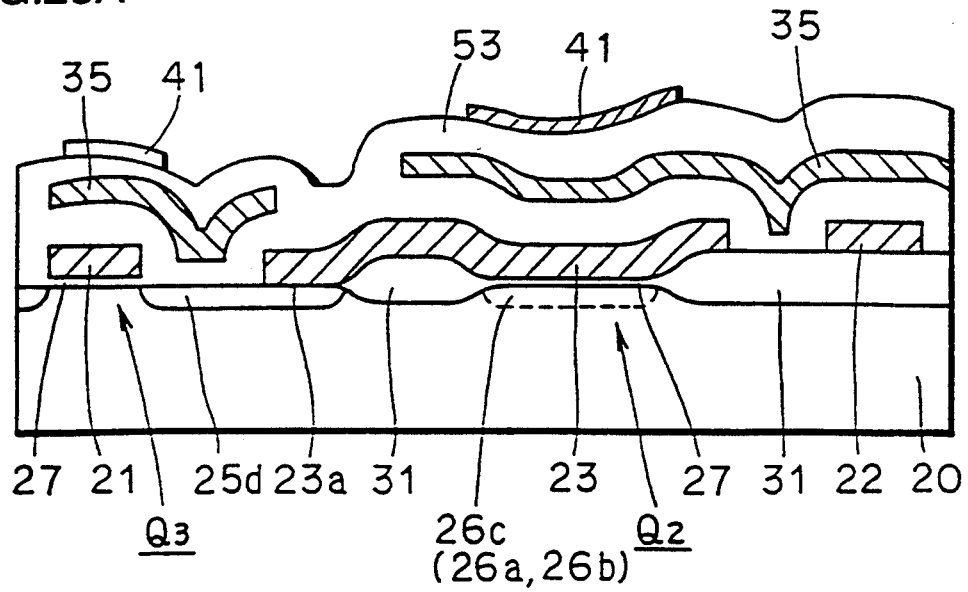
Figure 28B:
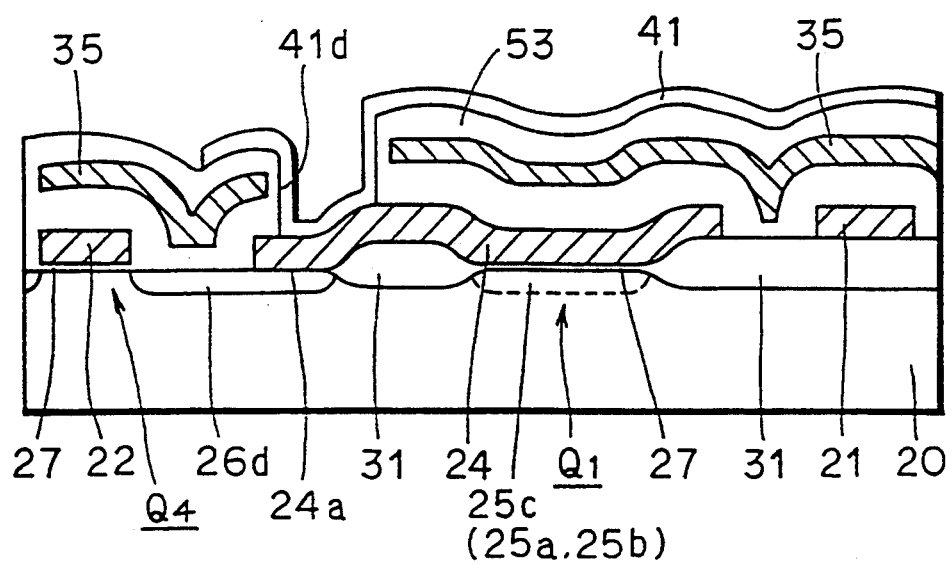

Referring to FIGS. 28A and 28B, first polycrystalline silicon film 41 is formed on the surface of insulating film 53. First polycrystalline silicon film 41 is in contact with the gate electrode 24 of driver transistor $Q_1$ through contact hole 41d. Then, annealing is performed at a temperature in the range from 500° C. to 700° C. for about 1-24 hours, and grains of first polycrystalline silicon film 41 are developed. Then, first polycrystalline silicon film 41 is patterned by means of photolithography and etching. After the patterning, an impurity is implanted into a portion of the polycrystalline silicon film to form a gate for load transistor $Q_6$. It is noted that the above-described annealing treatment may be performed after patterning first polycrystalline silicon film 41. An impurity may be implanted into part of the polycrystalline silicon film to be the gate of load transistor $Q_6$ after the patterning.

Figure 29A:
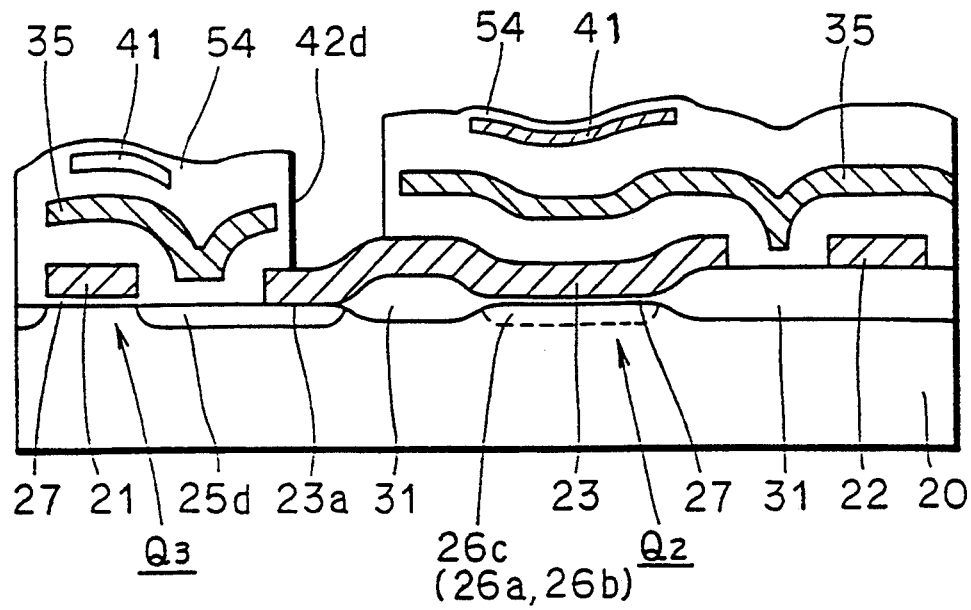
Figure 29B:
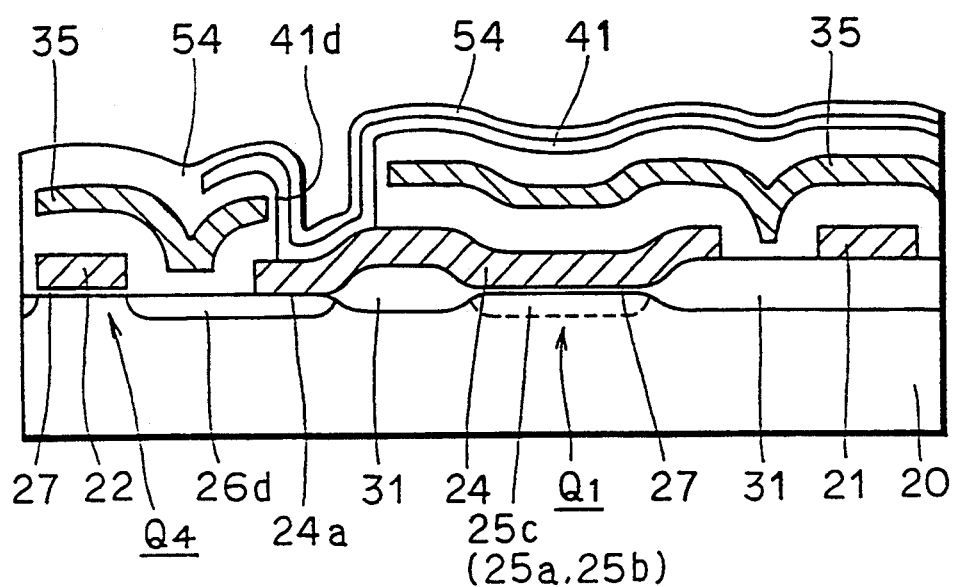

Referring to FIGS. 29A and 29B, an insulating film 54 to be a gate insulating film is deposited on the entire surface of the wafer. Then, a contact hole 42d is formed by means for photolithography and etching. Part of the surface of gate electrode 23 of driver transistor $Q_2$ is exposed from contact hole 42d.

Figure 30A:
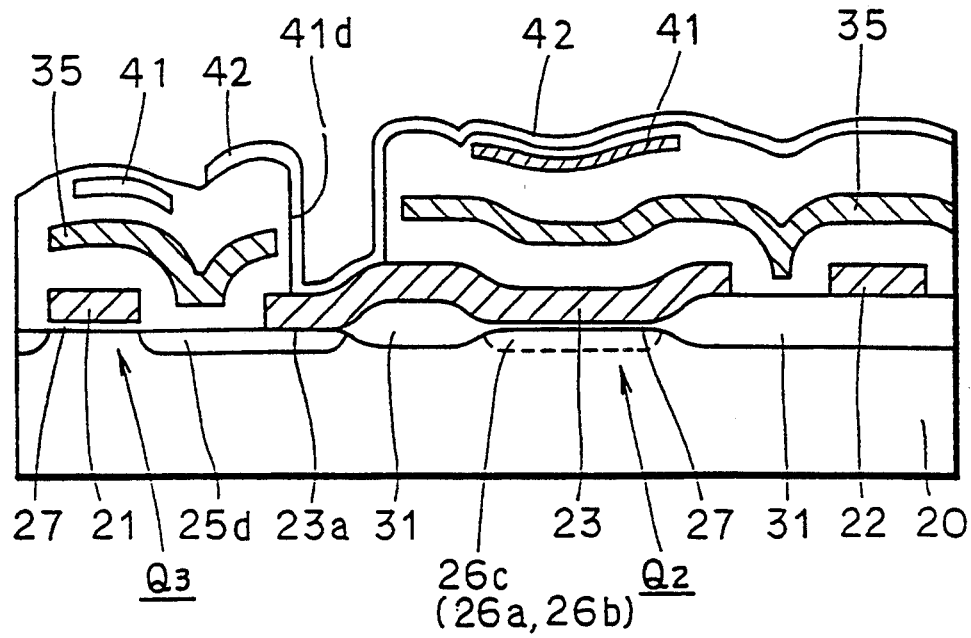
Figure 30B:
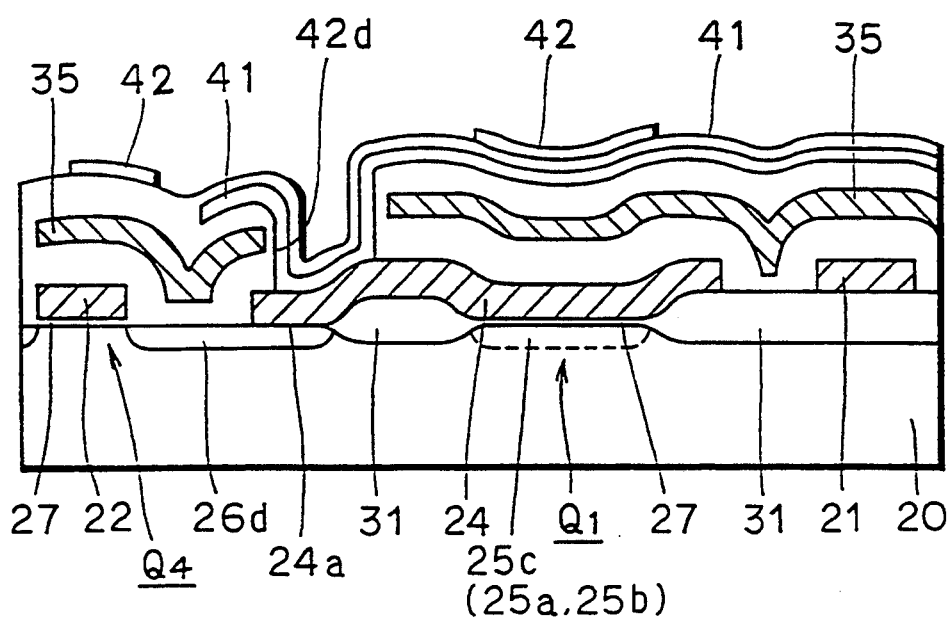

Referring to FIGS. 30A and 30B, second polycrystalline silicon film 42 is formed on the entire surface of the wafer. Second polycrystalline silicon film 42 is in contact with the gate electrode 23 of driver transistor $Q_2$ through contact hole 41d. Thereafter, annealing is performed at a temperature in the range from 500° C. to 700° C. for a time period in the range from 1 to 24 hours to grow grains of second polycrystalline silicon film 42. Thereafter, second polycrystalline silicon film 42 is patterned by means of photolithography and etching. The above-described annealing treatment may be performed after the patterning of second polycrystalline silicon film 42.

Figure 31A:
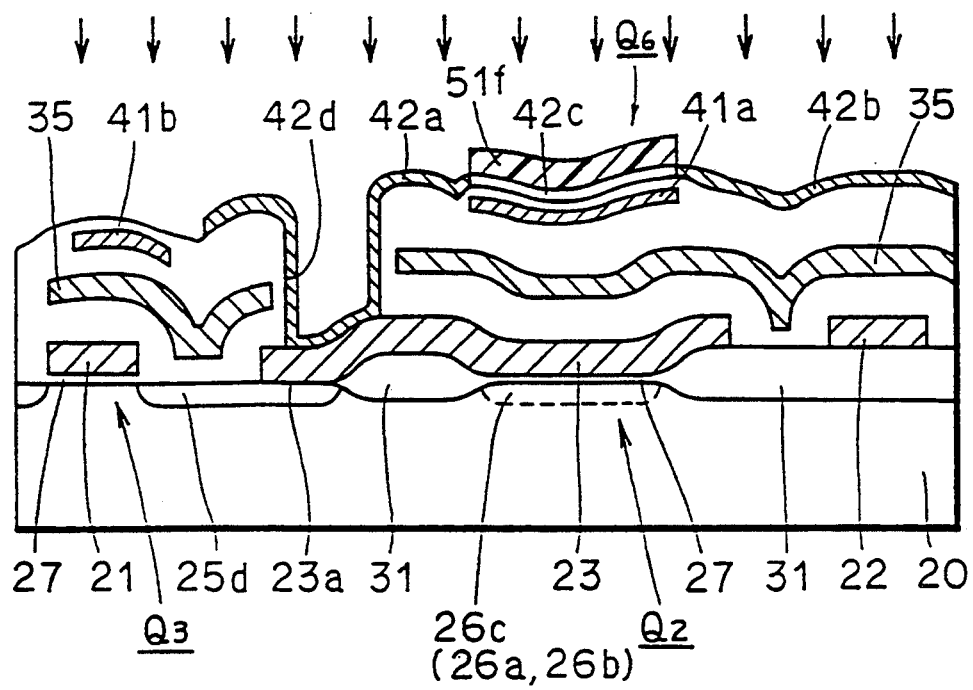
Figure 31B:
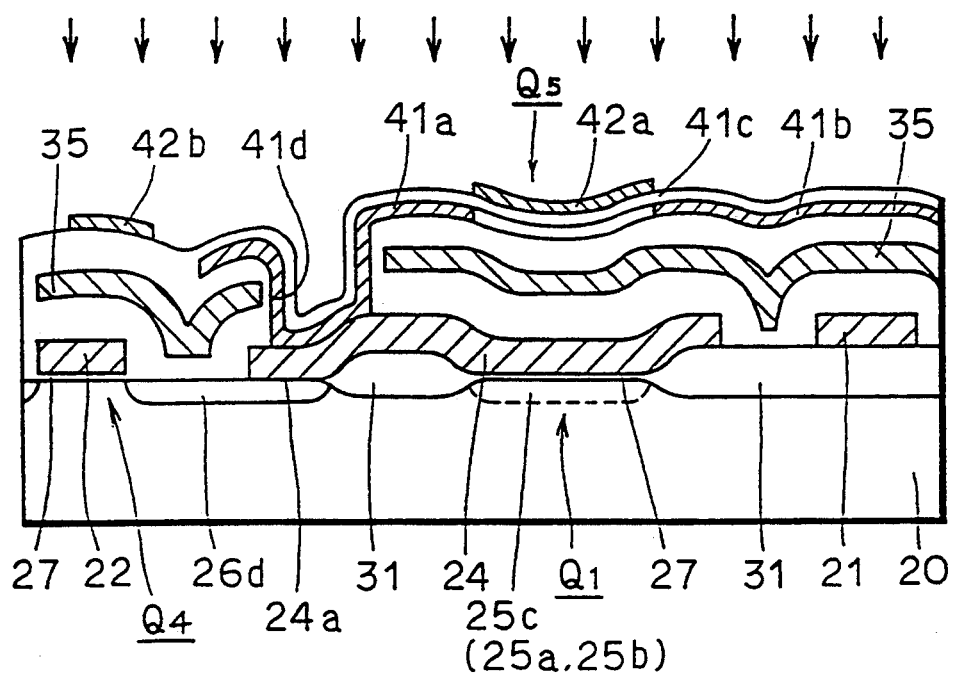

Referring to FIGS. 31A and 31B, photoresist 51f is formed to cover portion 42c to be the channel region of load transistor $Q_6$. Then, an impurity is implanted into the entire surface of the wafer, and a drain region 41a and a source region 41b are formed in first polycrystalline silicon film 41 with a channel region 41c therebetween. A drain region 42a and a source region 42b are formed with a channel region 42c therebetween in second polycrystalline silicon film 42. Thus, the source/drain regions of load transistors $Q_5$, $Q_6$ are formed at a time.

It is noted that if insulating film 54 to be the gate insulating film in the above-described manufacturing process can be formed at a temperature lower than 600° C., annealing treatment for growing grains of the polycrystalline silicon film may be performed only once after depositing second polycrystalline silicon film 42.

Then, photoresist 51f is removed away to form load transistors $Q_5$, $Q_6$ as illustrated in FIGS. 26A and 26B.

In the structure of load transistors $Q_5$, $Q_6$ shown in FIG. 25B, load transistor $Q_5$ constitutes a top gate type thin film transistor, while load transistor $Q_6$ constitutes a bottom gate type thin film transistor. The drain region of one transistor shares the gate electrode of the other transistor. Accordingly, size in the manufacture is less restricted by the limit of photolithography than forming both into top gate type or bottom gate type as in the case of the conventional load transistors shown in FIG. 43B.

More specifically, first polycrystalline silicon film 41 and second polycrystalline silicon film 42 are formed in different layers. Therefore, the lengths $L_1$, $L_2$ between first and second polycrystalline silicon films 41 and 42 are not restricted by the limit of photolithography techniques. Accordingly, the lengths $L_1$ and $L_2$ between the first and second polycrystalline silicon films 41 and 42 may be reduced compared to the minimum manufacturing size (about 0.35 μm) by photolithography. Therefore, in the structure of load transistors $Q_5$, $Q_6$ according to this embodiment, the area occupied by load transistors $Q_5$, $Q_6$ in plane can be reduced, and an SRAM memory cell structure suitable for high density integration can be provided.

Figure 32:
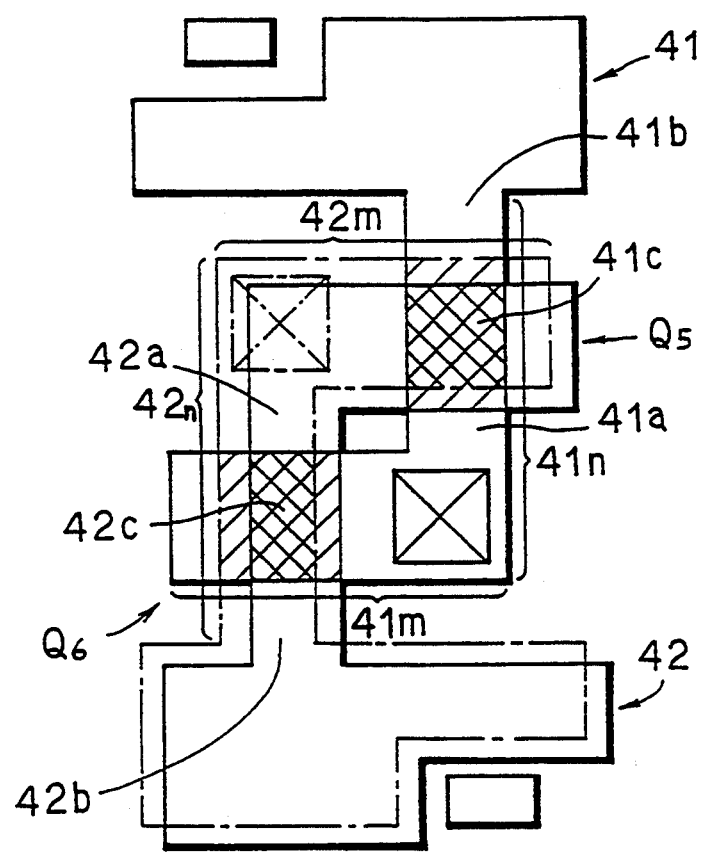
FIG. 32 is a view for use in illustration of an advantage in the load transistor employed for the SRAM memory cell structure according to the third embodiment of invention.

Furthermore, in the structure of load transistors $Q_5$, $Q_6$ according to this embodiment, as illustrated in FIG. 32, the strip portion 41n of first polycrystalline silicon film 41 and the strip portion 42m of second polycrystalline silicon film 42 intersect and constitute a top gate type load transistor. In the top gate type load transistor Q. An impurity is implanted into the underlying semiconductor layer 41 using the strip portion 42m to be a gate electrode as mask. Accordingly, in channel region 41c formed by this impurity implantation, the channel length and channel width are defined by the width of each of strip portions 41 and 42 intersecting in the vertical direction. These intersecting strip portions 42m and 41n are each formed to extend in a prescribed width. Accordingly, even if strip portions 41 and 42 are formed shifted from prescribed positions due to misregistration of the mask for example, as illustrated in FIG. 32, the channel length and the channel width in the top gate type load transistor $Q_5$ do not change. Therefore, determining the widths of strip portions 42m and 41n can readily provide top gate type load transistor $Q_5$ having a desired characteristic. Thus, stable operation can be achieved.

In addition, first polycrystalline silicon film 41 and second polycrystalline silicon film 42 are arranged in point symmetry when viewed two-dimensionally. This gives the following advantage to the SRAM memory cell structure of this embodiment.

Generally, the same performance is requested for a pair of load transistors $Q_5$ and $Q_6$. Referring to an equivalent circuit diagram in FIG. 42, if, for example, a storage node 114 is at "High", and a storage node 115 is at "Low", the potential of the High level side of storage node 114 falls at the time of reading and writing. Accordingly, after word line 109 is closed (after the memory cell is determined to be non-selected), the node potential of the High level side rises to Vcc. However, if ON current (current flowing in an ON state) is different between load transistors $Q_5$ and $Q_6$, time for the potential of storage node 114 to rise to Vcc when storage node 114 is at High is different from time for the potential of storage node 115 to rise to Vcc when storage node 115 is at High. Generally, the higher the potential at the High level of a storage node is, the more hardly soft errors occur. Therefore, if time for rising to Vcc is different between storage nodes 114 and 115, soft error rates will be different between data (depending upon which is a High between storage nodes 114 and 115).

Figure 42:
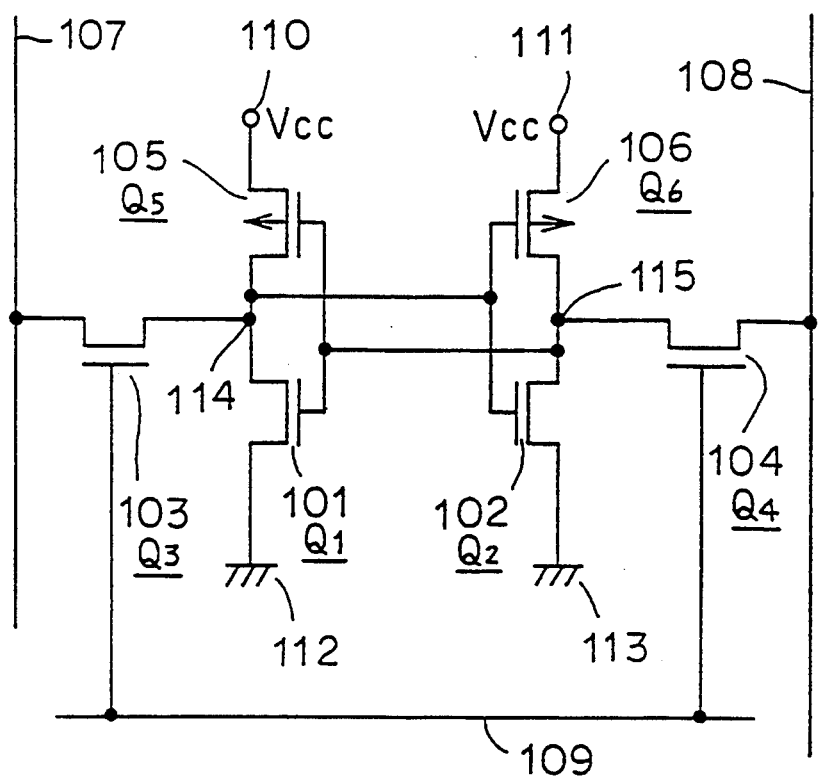
FIG. 42 is an equivalent circuit diagram showing a general SRAM.

Referring to an equivalent circuit diagram in FIG. 42, leakage current in a memory cell (referred to as standby current in the chip on the whole) at the time of stand-by (when address selection is not made) is determined by the OFF currents (current flowing in an OFF state) of load transistors $Q_5$ and $Q_6$. This is because, the OFF currents of load transistors $Q_5$ and $Q_6$ of thin film transistors are larger than driver transistors $Q_1$ and $Q_2$ formed on the substrate. Assuming that storage node 114 is at "High", and storage node 115 is at "Low", the leakage current of a memory cell is determined by the OFF current of thin film transistor $Q_6$ on the side of storage node 115 (Low level). Accordingly, if the OFF current of thin film transistor $Q_6$ when storage node 115 is at Low is different from the OFF current of thin film transistor $Q_5$ when storage node 114 is at Low, the leakage current of the memory cell significantly changes depending upon storage data (depending upon which is at High between storage nodes 114 and 115).

As described above, the performances of the pair of load transistors $Q_5$ and $Q_6$ are different, soft error ratios differ due to the difference between their ON currents, or the leakage current of a memory cell changes due to the difference between their OFF currents. The same performance is therefore required of load transistors $Q_5$ and $Q_6$.

Figure 51:
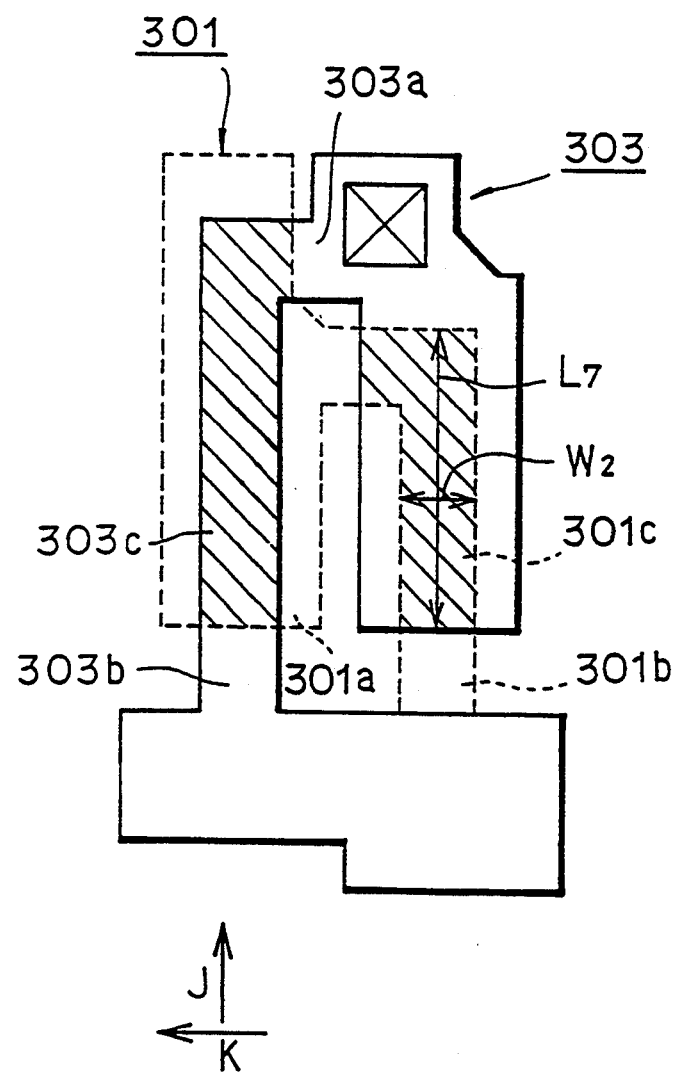
FIG. 51 is a plan view schematically showing the structure of a load transistor disclosed in a published document.
Figure 52:
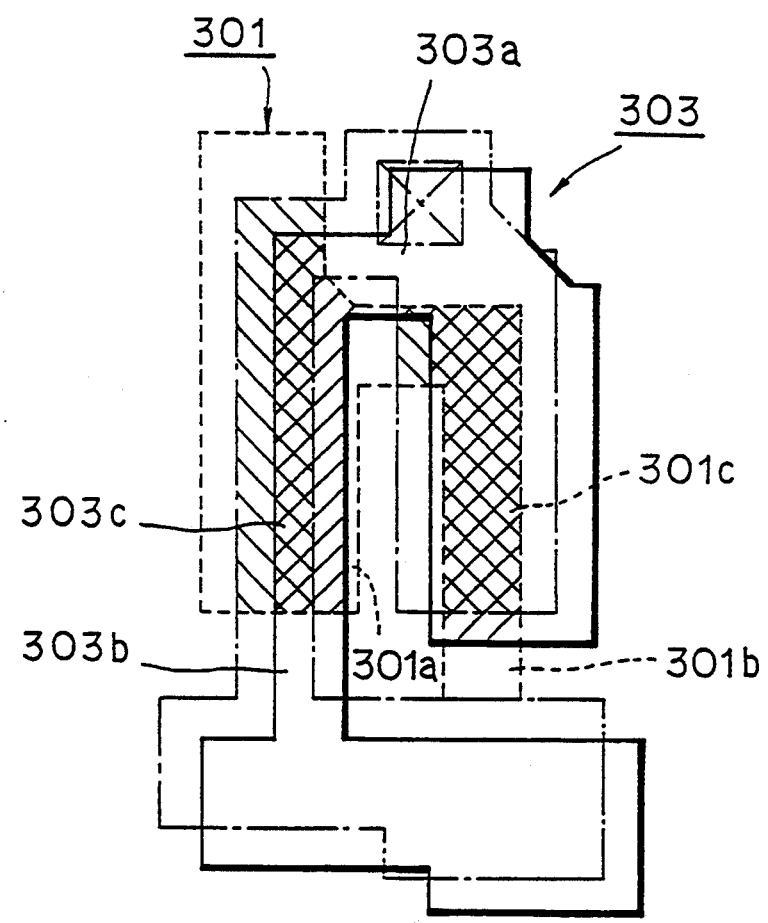
FIG. 52 is a representation for use in illustration of a disadvantage when mask misregistration is generated in the load transistor shown in FIG. 51.

If, for example, as illustrated in FIG. 51, the forms of polycrystalline silicon films in the upper layer and the lower layer are asymmetrical, the size of the channel region can easily be changed due to mask misregistration or the like as described above. Accordingly, asymmetrical forms of first and second polycrystalline silicon layers like load transistors shown in FIG. 51 makes it difficult to obtain the same performance for load transistors $Q_5$ and $Q_6$ and can be responsible for the above-described disadvantages.

In contrast, in the case of load transistors $Q_5$ and $Q_6$ according to this embodiment, the two layers, polycrystalline silicon films 41 and 42 constituting a transistor have symmetrical forms. Accordingly, determining the size of one polycrystalline silicon layer makes it easier to set the channel regions of the two transistors $Q_5$ and $Q_6$ to be the same. Upon mask misregistration, the sizes of the channel regions 41c and 42c of load transistors $Q_5$ and $Q_6$ are maintained to be the same if polycrystalline silicon layers 41 and 42 are symmetrical in form. Accordingly, soft error ratio and memory cell leakage current are restrained from being different between the transistors.

Embodiment 4

Now, a load transistor used for an SRAM memory cell structure according to a fourth embodiment of the invention will be described.

Figure 33:
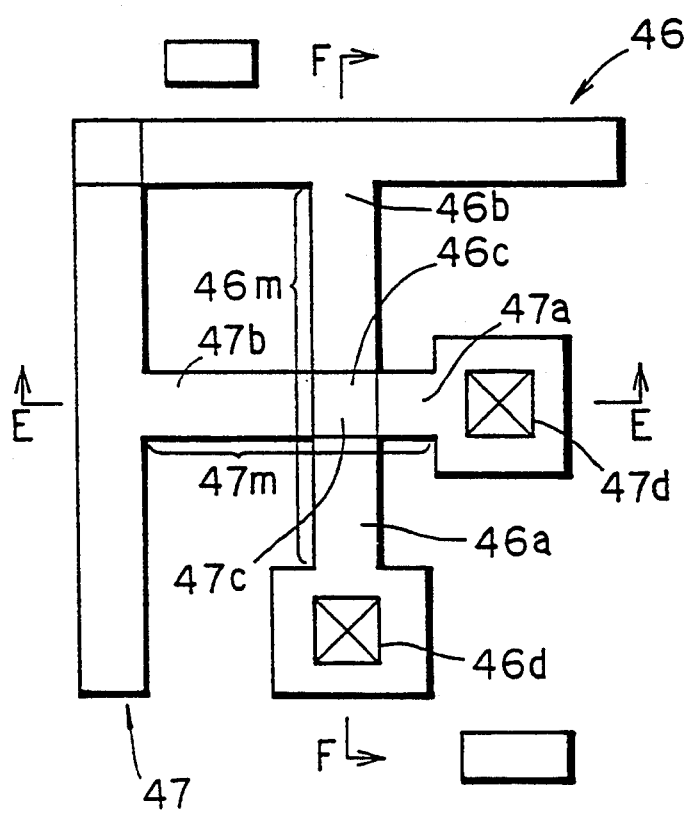
FIG. 33 is a plan view schematically showing the structure of a load transistor employed for an SRAM memory cell structure according to a fourth embodiment of the invention.
Figure 34A:
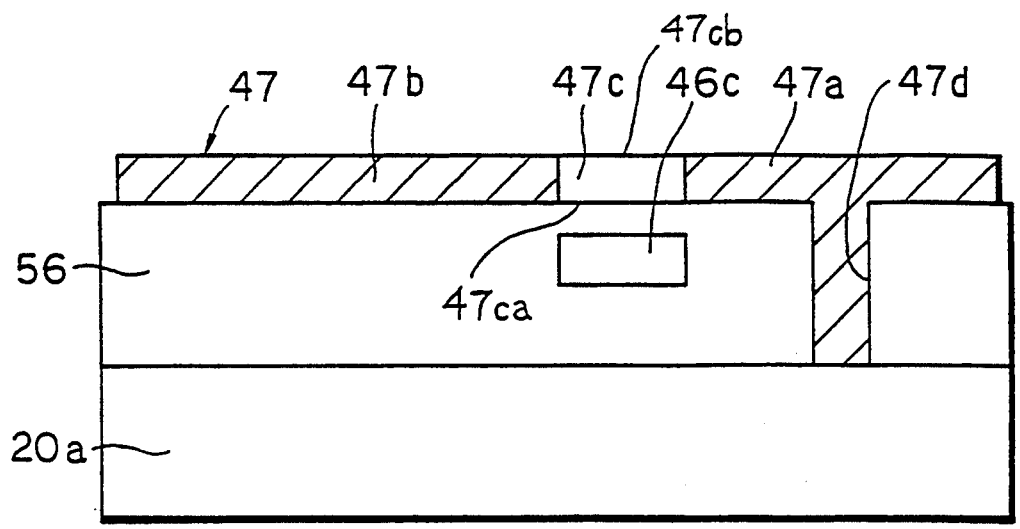
FIG. 34A and 34B are schematic sectional views taken along lines E—E and F—F in FIG. 33; 895
Figure 34B:
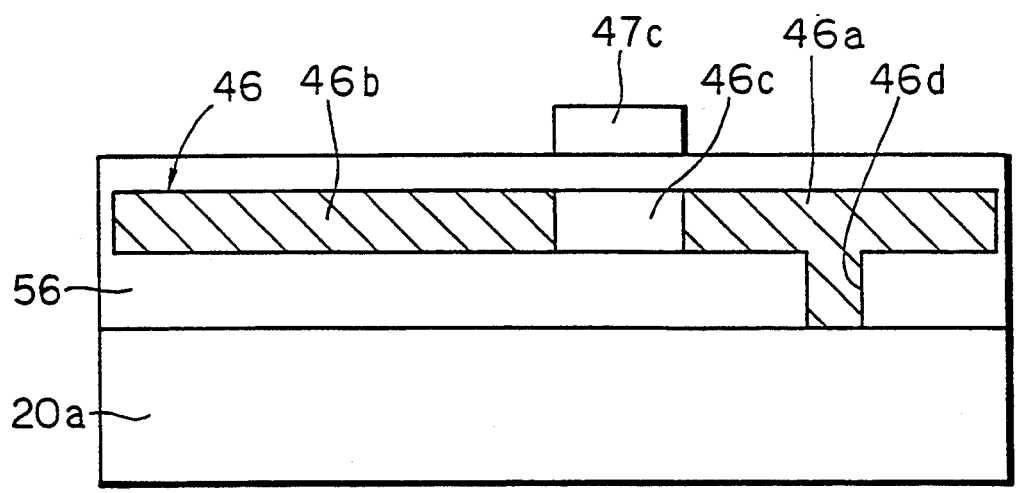

FIG. 33 is a plan view schematically showing the structure of a load transistor employed for the SRAM memory cell structure according the fourth embodiment of the invention. FIGS. 34A and 34B are schematic cross sectional views taken along lines E—E and F—F in FIG. 33.

Referring to FIGS. 33, 34A and 34B, a pair of load transistors are formed of first and second polycrystalline silicon films 46 and 47. More specifically, one load transistor includes a drain region 46a and a source region 46b formed on the strip portion 46m of first polycrystalline silicon film 46 with a channel region 46c therebetween, and a portion 47c to be a gate formed on the strip portion 47m of second polycrystalline silicon film 47. The other load transistor includes a drain region 47a and a source region 47b formed at the strip portion 47m of second polycrystalline silicon film 47 with a channel region 47c therebetween, and a portion 46c to be a gate formed at the strip portion 46m of first polycrystalline silicon film 46. Thus, one load transistor forms a top gate type thin film transistor, while the other load transistor a bottom gate type thin film transistor. Channel regions 46c and 47c of the load transistors function as each other's gate electrode portions.

The drain region 46a of first polycrystalline silicon film 46 is connected to the gate electrode (not shown) of one driver transistor through a contact hole 46d. The drain region 47a of second polycrystalline silicon film 47 is connected to the gate electrode (not shown) of the other driver transistor through a contact hole 47d.

It is noted that the description of driver transistors, access transistors, etc. in FIGS. 34A and 34B is omitted. However, for the structure of driver transistors and access transistors, the structure shown in FIG. 25A can be employed.

Now, a method of manufacturing the load transistor pair shown in FIGS. 33, 34A, and 34B will be described in conjunction with cross sectional views corresponding to FIGS. 34A and 34B.

FIGS. 35A–39A and FIGS. 35B–39B are schematic sectional views corresponding to FIGS. 34A and 34B illustrating in the order of steps a method of manufacturing a load transistor used for the SRAM memory cell structure according to the third embodiment of the invention.

Figure 35A:
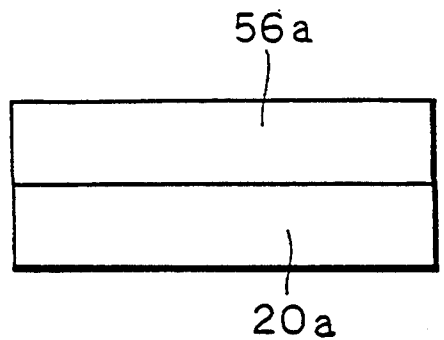
Figure 35B:
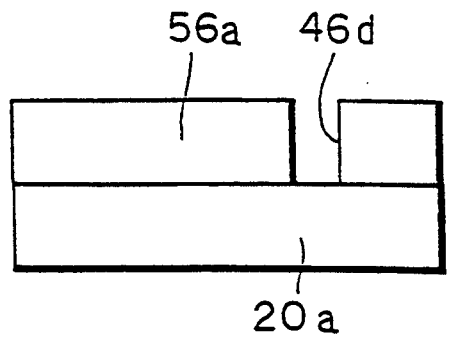

Referring to FIGS. 35A and 35B, an insulating film 56a is formed on the entire surface of a lower layer 20a including the substrate. Contact hole 46d is formed in insulating film 56a by means of photolithography and etching. The surface of the gate electrode (not shown) of one driver transistor is partially exposed from contact hole 46d.

Figure 36A:
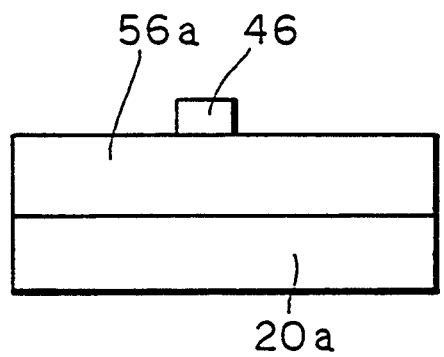
Figure 36B:
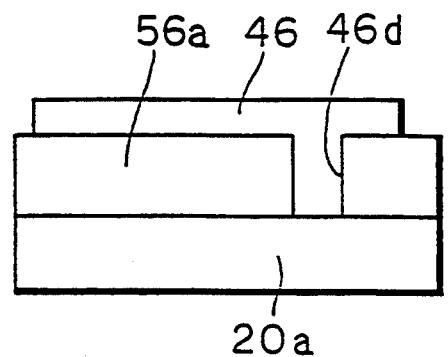

Referring to FIGS. 36A and 36B, first polycrystalline silicon film 46 is formed on the entire surface of insulating film 56a. First polycrystalline silicon film 46 is in contact with the gate electrode (not shown) of one driver transistor through contact hole 46d. Subsequently, first polycrystalline silicon film 46 is subject to annealing at a temperature in the range from 500° C. to 700° C. for about 1–24 hours, to grow grains of first polycrystalline silicon film 46. Then, first polycrystalline silicon film 46 is patterned by photolithography and etching. It is noted that the above-described annealing process may be performed after patterning first polycrystalline silicon film 46.

Figure 37A:
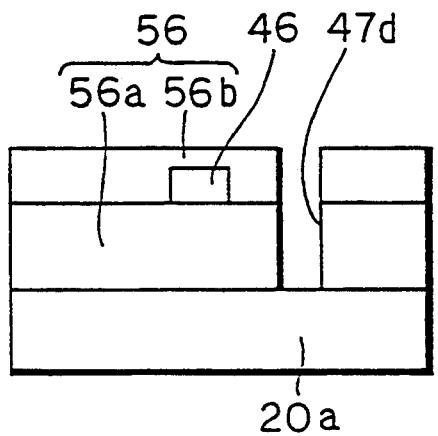
Figure 37B:
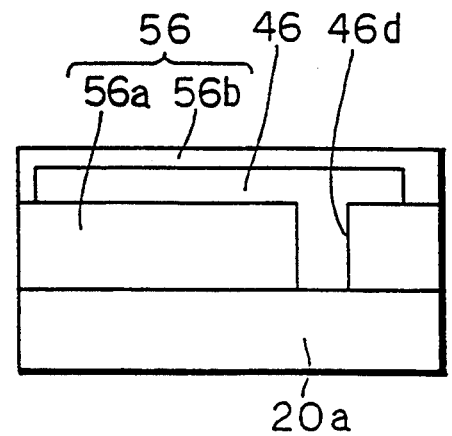

Referring to FIGS. 37A and 37B, an insulating film 56b is formed on the entire surface of the wafer to cover the surface of first polycrystalline silicon film 46. A contact hole 47d is formed in insulating film 56 formed of insulating films 56a and 56b by photolithography and etching. The surface of the gate electrode (not shown) of the other driver transistor is partially exposed from contact hole 47d.

Figure 38A:
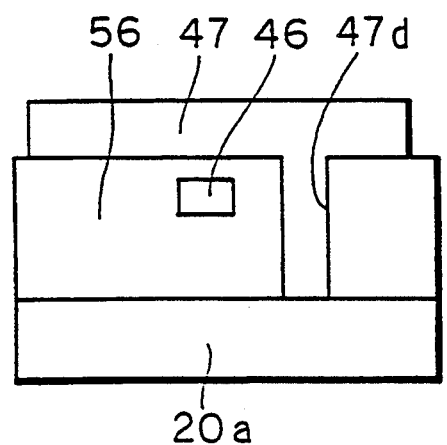
Figure 38B:
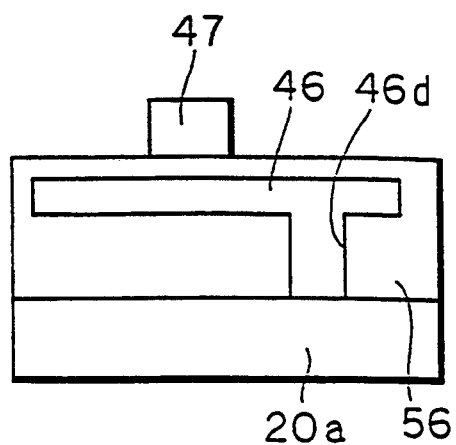

Referring to FIGS. 38A and 38B, second polycrystalline silicon film 47 is deposited on the entire surface of insulating film 56. Second polycrystalline silicon film 47 is in contact with the gate electrode (not shown) of the other driver transistor through contact hole 47d. Subsequently, second polycrystalline silicon film 47 is subject to annealing at a temperature in the range from 500° C. to 700° C. for about 1–24 hours, thus growing grains of second polycrystalline silicon film 47. Then, second polycrystalline silicon film 47 is patterned by photolithography and etching. It is noted that the above-described annealing process may be performed after patterning second polycrystalline silicon film 47.

Figure 39A:
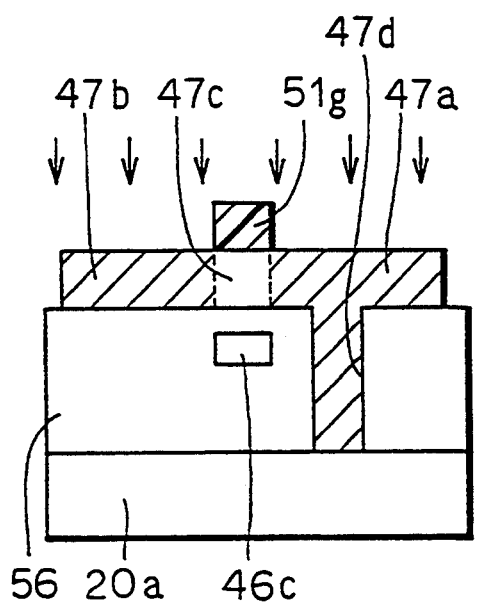
Figure 39B:
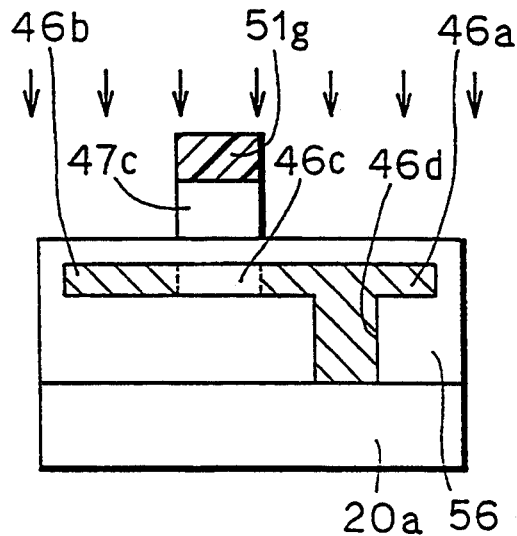

Referring to FIGS. 39A and 39B, photoresist 51g is formed on portion 47c to be the channel region of second polycrystalline silicon film 47. An impurity is implanted using the photoresist 51g as mask, to form at a time the source/drain regions of a pair of bottom gate type and top gate type load transistors. More specifically, this impurity implantation forms drain region 47a and source region 47b with channel region 47c therebetween, and drain region 46a and source 46b with channel region 46c therebetween. Subsequently, photoresist 51g is removed away and the pair of load transistors formed of thin film transistors shown in FIGS. 34A and 34B are produced.

According to this embodiment, one of the load transistor pair is formed of a bottom gate type thin film transistor and the other is formed of a top gate thin film transistor. The channel region of each transistor shares a gate electrode with the other transistors. Accordingly, the pair of load transistors shown in FIG. 43B are both less subject to limitations of size in the manufacture by means of photolithography as compared to a pair of top gate type transistors or a pair of bottom gate type transistors.

The channel regions 46c and 47c of the pair of load transistors oppose each other, with one functioning as the gate electrode of the other. Therefore, as opposed to the structure according to the first embodiment shown in FIG. 25B, the crossing region of first and second polycrystalline silicon films 46 and 47 may be only one. Thus, the area occupied by the pair of load transistors in plane can be reduced. Therefore, an SRAM memory cell structure suitable for high density integration can be provided.

In the structure of load transistors according to this embodiment, channel regions 46c and 47c are formed in the crossing region of first and second polycrystalline silicon films 46 and 47. Therefore, the channel length and channel width of each of the channel regions 46c and 47c are defined by the widths of strip shaped portions 46m and 47m. As a result, even if second polycrystalline silicon film 47 is shifted from first polycrystalline silicon film 46 due to mask misregistration, the channel length and channel width of each channel region 46c, 47c defined by the widths of strip portions 46m and 47m do not change. Consequently, a load transistor having desired characteristic can readily be provided. Thus, stable operation can be secured in operation.

Generally, if a polycrystalline silicon film is deposited, the lower surface of the polycrystalline silicon film becomes rougher than the upper surface. More specifically, referring to FIG. 34A, generally, the lower surface 47ca of second polycrystalline silicon film 47 becomes rougher than upper surface 47cb. Accordingly, in a transistor utilizing the vicinity of the lower surface 47ca of polycrystalline silicon film 47 as a channel region as the bottom gate type shown in FIG. 34A, scattering attributable to the roughness of the surface region 47ca of the channel reduces the degree of movement of electrons flowing across channel region 47c. Therefore, the bottom gate type generally exhibits poorer performance than the top gate type.

In the third and fourth embodiments of the invention, in order to improve the performance of a bottom gate type transistor, the thickness of polycrystalline silicon film 47 in the upper layer in which the channel region 47c of the transistor is to be formed is made thick. More specifically, the thickness of the lower polycrystalline silicon film 46 is 1500 Å, while the thickness of the upper polycrystalline silicon film 47 is 2000 Å. Forming the thickness of the upper polycrystalline silicon film 47 thick reduces the influence of the unevenness of lower surface 47ca upon electrons moving across channel region 47c. More specifically, the ratio of electrons affected by the rough surface is reduced, and therefore the degree of movement of electrons is kept from decreasing.

Embodiment 5

Now, the structure of a load transistor permitting further reduction of the size of an SRAM memory structure according to a fifth embodiment will be described.

Figure 40:
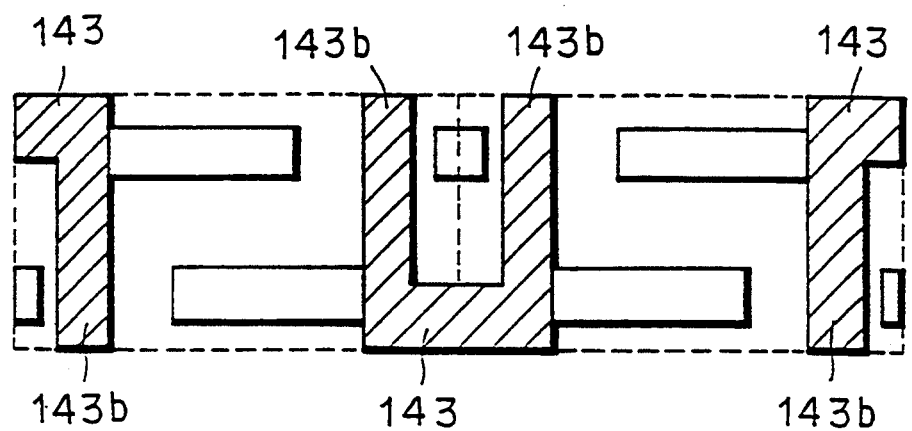
FIG. 40 is a plan view schematically showing the structure of a conventional load transistor for two memory cell regions.

FIG. 40 is a schematic plan view in which the gate electrode is omitted from the load transistor shown in FIG. 43B. Referring to FIG. 40, conventionally, two Vcc interconnection regions 143b shown as the shadowed portion are disposed in the region surrounded by the dotted line (the region of one memory cell).

Figure 41:
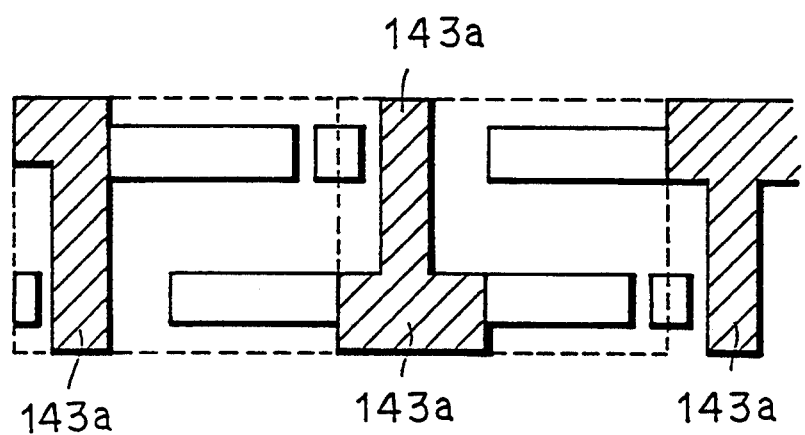
FIG. 41 is a plan view schematically showing the structure of a load transistor employed for an SRAM memory cell structure for two memory cells according to a fifth embodiment of the invention.

FIG. 41 is a plan view schematically showing the structure of a load transistor used for an SRAM memory cell in the fifth embodiment of the invention. Referring to FIG. 41, in the embodiment, one Vcc interconnection region 143a in oblique line is disposed in the region surrounded by the dotted line (the region of one memory cell). Accordingly, another Vcc interconnection region 143a is not necessary in the region surrounded by the dotted line, and therefore the size of the memory cell region can be reduced by the amount. Accordingly, the structure of a load transistor used for an SRAM memory cell suitable for high intensity integration can be provided.

It is noted that although in the description of this embodiment the pair of load transistors forming a memory cell are both of top gate type or bottom gate type, one of the pair of load transistors may be of top gate type while the other may be of bottom gate type.

It is noted that in the first, second, third, fourth and fifth embodiments described above, the use of polycrystalline silicon films as semiconductor layers constituting the load transistors have been described, but the invention is not limited thereto, and films formed of silicon monocrystal may be utilized.

Combining the above-described first, second, third, fourth and fifth embodiments described above can provide an SRAM memory cell structure which can cope with high density integration while maintaining stable reading operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, including a static memory cell having a pair of driver transistors of first type conductivity and a pair of load transistors of second type conductivity constituting a flip-flop circuit, and a pair of access transistors, comprising:

a semiconductor substrate having a main surface; a first field effect transistor forming each of said driver transistors formed on the main surface of said semiconductor substrate; and a second field effect transistor forming each of said access transistors formed on the main surface of said semiconductor substrate, wherein
said first field effect transistor includes,
a first gate insulating film formed on the main surface of said semiconductor substrate and having a first dielectric constant, and
a first gate electrode formed on said first gate insulating film, and
said second field effect transistor includes,
a second gate insulating film formed on the main surface of said semiconductor substrate and having a second dielectric constant smaller than the first dielectric constant, and
a second gate electrode formed on said second gate insulating film.

2. A semiconductor memory device as recited in claim 1, wherein
said first gate insulating film includes a first insulating film and a second insulating film having a dielectric constant different from said first insulating film, and
said second gate insulating film includes a third insulating film.

3. A semiconductor memory device as recited in claim 2, wherein
said first insulating film includes a silicon oxide film, said second insulating film includes a silicon nitride film, and said third insulating film includes a silicon oxide film.

4. A semiconductor memory device as recited in claim 1, wherein
said first gate insulating film includes a first insulating film, a second insulating film having a dielectric constant different from said first insulating film, and a third insulating film having a dielectric constant different from said second insulating film, and
said second gate insulating film includes a fourth insulating film.

5. A semiconductor memory device as recited in claim 4, wherein
said first, third, and fourth insulating films each include a silicon oxide film.

6. A semiconductor memory device as recited in claim 1, wherein
said first gate insulating film includes a first insulating film, and
said second gate insulating film includes a second insulating film, and a third insulating film having a dielectric constant different from said second insulating film.

7. A semiconductor memory device as recited in claim 6, wherein
said first insulating film includes a silicon oxide film, said second insulating film includes a silicon oxide film, and said third insulating film includes a silicon nitride film.

8. A semiconductor memory device as recited in claim 1, wherein
said first gate insulating film includes a first insulating film, and
said second gate insulating film includes a second insulating film, a third insulating film having a dielectric constant different from said second insulating film, and a fourth insulating film having a dielectric constant different from said third insulating film.

9. A semiconductor memory device as recited in claim 8, wherein
said first, second and fourth insulating films each include a silicon oxide film.

10. A semiconductor memory device including a static type memory cell having a pair of driver transistors of first type conductivity type and a pair of load transistors of second type conductivity constituting a flipflop circuit, and a pair of access transistors, said driver transistors and said access transistors being formed of field effect transistors formed on a main surface of a semiconductor substrate, said load transistors being formed of first and second thin film transistors formed on said field effect transistors, said semiconductor memory device comprising:
a first semiconductor layer formed on said semiconductor substrate and having a first strip portion extending in a first direction, and a second strip portion extending in a second direction;
a second semiconductor layer formed on said first semiconductor layer and having a third strip portion extending in a third direction crossing said second direction, and a fourth strip portion extending in a fourth direction crossing said first direction;
first source and drain regions formed in first strip portion spaced apart from each other to define a first channel region opposite to said fourth strip portion and forming said first thin film transistor;
second source and drain regions formed in the third strip portion spaced apart from each other to define a second channel region opposite to said second strip portion and forming said second thin film transistor;
a first gate insulating film formed between said fourth strip portion and said first channel; and
a second gate insulating film formed between said second strip portion and said second channel region,
said first semiconductor layer and said second semiconductor layer overlapping each other between said first strip portion and said fourth strip portion, and between said second strip portion and said third strip portion.

11. A semiconductor memory device as recited in claim 10, wherein
the thickness of said first semiconductor layer is smaller than the thickness of said second semiconductor layer.

12. A semiconductor memory device as recited in claim 11, wherein
the thickness of said first semiconductor layer is approximately 1500 Å, while the thickness of said second semiconductor layer is approximately 2000 Å.

13. A semiconductor memory device as recited in claim 10, wherein
said first gate insulating film and said second insulating film are formed of the same layer.

14. A semiconductor memory device including a static type memory cell having a pair of driver transistors of first type conductivity and a pair of load transistors of second type conductivity constituting a flipflop circuit, and a pair of access transistors, comprising:
a semiconductor substrate having a main surface;
a first field effect transistor forming each of said driver transistors formed on the main surface of said semiconductor substrate; and a second field effect transistor forming each of said access transistors formed on the main surface of said semiconductor substrate, said first field effect transistor having a pair of first source and drain regions formed a distance apart from each other at the main surface of said semiconductor substrate, a first channel region of said semiconductor substrate between said pair of first source and drain regions having a first impurity concentration profile, the first impurity concentration profile having an impurity concentration peak at a first depth position from said main surface, said second field effect transistor having a pair of second source and drain regions formed a distance apart from each other at said semiconductor substrate, a second channel region of said semiconductor substrate between said pair of second source and drain regions having a second impurity concentration profile, the second impurity concentration profile having an impurity concentration peak at a second depth position shallower than said first depth position from said main surface, at a position deeper than said second depth position, said first impurity concentration profile giving a higher concentration value than said second impurity concentration profile.

15. A semiconductor memory device including a static type memory cell having a pair of driver transistors of first type conductivity and a pair of load transistors of second type conductivity constituting a flipflop circuit, and a pair of access transistors, comprising:

a semiconductor substrate having a main surface;

a first field effect transistor forming each of said driver transistors formed at the main surface of said semiconductor substrate; and a second field effect transistor forming each of said access transistors formed at the main surface of said semiconductor substrate, said first field effect transistor having a pair of first source and drain regions formed a distance apart from each other at the main surface of said semiconductor substrate, a first channel region of said semiconductor substrate between said pair of first source and drain regions having a first impurity concentration profile, the first impurity concentration profile having an impurity concentration peak at a first depth position from said main surface, said second field effect transistor having a pair of second source and drain regions formed a distance apart from each other at the main surface of said semiconductor substrate, a second channel region of said semiconductor substrate between said pair of second source and drain regions having a second impurity concentration profile, the second impurity concentration profile having an impurity concentration peak at a second depth position shallower than said first depth position from said main surface, the amount of impurity determined by said first impurity concentration profile up to a third depth position deeper than said first depth position is larger than the amount of impurity determined by said second impurity concentration profile from said main surface to said third depth position.

16. A semiconductor memory device, including a static memory cell having a pair of driver transistors of first type conductivity and a pair of load transistors of second type conductivity constituting a flipflop circuit, and a pair of access transistors, comprising:

a semiconductor substrate having a main surface;

a first field effect transistor forming each of said driver transistors formed on the main surface of said semiconductor substrate; and a second field effect transistor forming each of said access transistors formed on the main surface of said semiconductor substrate, wherein said first field effect transistor includes a first gate insulating film formed on the main surface of said semiconductor substrate and having a first thickness and first dielectric constant, and a first gate electrode formed on said first gate insulating film, said second field effect transistor includes a second gate insulating film formed on the main surface of said semiconductor substrate and having a second thickness and second dielectric constant, and a second gate electrode formed on said second gate insulating film, and the ratio of the first dielectric constant to the first thickness is greater than the ratio of the second dielectric constant to the second thickness.

* * * * *